US009012982B2

(12) United States Patent
Kim et al.

(10) Patent No.: US 9,012,982 B2
(45) Date of Patent: Apr. 21, 2015

(54) RECESSED TRANSISTOR AND METHOD OF MANUFACTURING THE SAME

(75) Inventors: Keun-Nam Kim, Suwon-si (KR); Makoto Yoshida, Suwon-si (KR); Chul Lee, Seoul (KR); Dong-Gun Park, Seongnam-si (KR); Woun-Suck Yang, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 1231 days.

(21) Appl. No.: 12/068,179

(22) Filed: Feb. 4, 2008

(65) Prior Publication Data
US 2008/0185641 A1 Aug. 7, 2008

(30) Foreign Application Priority Data
Feb. 5, 2007 (KR) ........................ 10-2007-0011527

(51) Int. Cl.
  *H01L 29/66* (2006.01)
  *H01L 29/78* (2006.01)
(52) U.S. Cl.
  CPC .... *H01L 29/66795* (2013.01); *H01L 29/66621* (2013.01); *H01L 29/7834* (2013.01); *H01L 29/7851* (2013.01)
(58) Field of Classification Search
  USPC ............... 257/330, E27.091, E29.257, E29.2
  See application file for complete search history.

(56) References Cited

U.S. PATENT DOCUMENTS

| | | | | |
|---|---|---|---|---|
| 6,683,354 B2* | 1/2004 | Heo et al. | ...................... | 257/397 |
| 6,930,062 B2* | 8/2005 | Hyun et al. | ................... | 438/790 |
| 7,550,325 B2* | 6/2009 | Koyama et al. | ............... | 438/149 |
| 7,560,359 B2* | 7/2009 | Park | .............................. | 438/426 |
| 2005/0020086 A1* | 1/2005 | Kim et al. | ..................... | 438/700 |
| 2005/0194597 A1* | 9/2005 | Seo et al. | ......................... | 257/71 |
| 2005/0233513 A1* | 10/2005 | Kim et al. | ..................... | 438/197 |
| 2006/0237817 A1* | 10/2006 | Park | ............................. | 257/500 |
| 2007/0138545 A1* | 6/2007 | Lin et al. | ....................... | 257/330 |

FOREIGN PATENT DOCUMENTS

| | | |
|---|---|---|
| KR | 10-2005-0011376 | 1/2005 |
| KR | 10-0593734 | 6/2006 |
| KR | 10-0608386 | 7/2006 |
| KR | 0696764 | 3/2007 |

OTHER PUBLICATIONS

Korean Office Action dated Jan. 25, 2008 for counterpart Korean Patent Application No. 10-2007-11527.

* cited by examiner

*Primary Examiner* — Mark Tornow
(74) *Attorney, Agent, or Firm* — Harness, Dickey & Pierce

(57) ABSTRACT

A recessed transistor and a method of manufacturing the same are provided. The recessed transistor may include a substrate, an active pin, a gate pattern and source and drain regions. The substrate may include an isolation layer that establishes an active region and a field region of the substrate. The substrate may include a recessed structure having an upper recess formed in the active region and a lower recess in communication with the upper recess. An active pin may be formed in a region between side surfaces of the isolation layer and the lower recess and an interface between the active region and the field region. The gate pattern may include a gate insulation layer formed on an inner surface of the recessed structure and a gate electrode formed on the gate insulation layer in the recessed structure. The source/drain regions may be formed adjacent to the active region and the gate electrode.

10 Claims, 31 Drawing Sheets

RECESSED TRANSISTOR AND METHOD OF MANUFACTURING THE SAME

PRIORITY STATEMENT

This application claims the benefit of priority under 35 U.S.C. §119 to Korean Patent Application No. 2007-11527, filed on Feb. 5, 2007 in the Korean Intellectual Property Office (KIPO), the contents of which are herein incorporated by reference in their entirety.

BACKGROUND

1. Field

Example embodiments relate to a recessed transistor and a method of manufacturing the same. Other example embodiments relate to a recessed transistor including a gate structure that is formed in a recessed structure of an active region and a method of manufacturing the recessed transistor.

2. Description of the Related Art

As semiconductor devices become more highly integrated, it is desirable to decrease widths of each pattern and the intervals between the patterns of the semiconductor device. In order to decrease the width (and intervals) of each pattern, it is desirable to obtain a more precisely and accurately formed minute pattern. In the semiconductor device, a width of a gate may decrease (or be narrowly formed) in proportion to a decrease in a design rule of the semiconductor device in order to develop (or form) a semiconductor device including a recessed gate electrode, which has an elongated effective channel length with a minute (or substantially smaller) width.

FIG. 1 is a diagram illustrating a cross-sectional view of a conventional recessed gate structure. FIG. 2 is a graph showing an effective charge density per unit gate length along a surface of a channel in the recessed gate structure in FIG. 1.

Referring to FIGS. 1 and 2, the conventional recessed gate structure 10 includes a semiconductor substrate 1 having a recess R, a gate insulation layer 2 formed along a side surface and a bottom surface of the recess and a gate electrode 3 formed in the recess.

Comparing the recessed gate structure 10 to a planar gate structure including a channel that is formed along a gate insulation layer on a semiconductor substrate, the recessed gate structure 10 may have a larger channel length. The effective charge density per the unit gate length may change according to the shape of the recess. The effective charge density per the unit gate length may change substantially according to a profile of the gate insulation layer (indicated by arrows in FIGS. 1 and 2) on the bottom surface of the recess such that swing characteristics are undesirable. The gate structure may have decreased electrical characteristics.

SUMMARY

Example embodiments relate to a recessed transistor and a method of manufacturing the same. Other example embodiments relate to a recessed transistor including a gate structure that is formed in a recessed structure of an active region and a method of manufacturing the recessed transistor.

Example embodiments provide a recessed transistor having increased electrical characteristics and a method of manufacturing the same.

A recessed transistor in accordance with example embodiments includes a substrate, an active pin, a gate pattern and/or source/drain regions. The substrate may include an isolation layer and a recessed structure. The isolation layer establishes an active region and a field region of the substrate. The recessed structure has an upper recess formed in the active region and a lower recess connected to (or in communication with) the upper recess. The active pin may be formed in a region between side surfaces of the isolation layer and the lower recess. The active pin may be formed in a region between side surfaces of an interface between the active region and the field region. The gate pattern may include a gate insulation layer formed on an inner surface of the recessed structure and a gate electrode formed on the gate insulation layer in the recessed structure. The source/drain regions may be formed adjacent to the active region and the gate electrode.

According to example embodiments, the upper recess may have a first width and the lower recess may have a second width less than the first width. The upper recess may have a side surface substantially perpendicular to the substrate. There may be at least one active pin. The active pin may be arranged (or formed) adjacent to the interface between the active region and the field region. The active pin may be formed along an extension (or vertical) direction of the gate electrode. The isolation layer may have an inclined side surface. A cross-sectional area of the inclined side may gradually increase (or enlarge) towards an upper surface of the substrate.

According to example embodiments, the isolation layer may include a first insulation layer pattern and a second insulation layer pattern under (or beneath) the first insulation layer pattern. The second isolation layer pattern may have an inclined side surface having a gradually, enlarged cross-sectional area toward an upper surface of the substrate. The first insulation layer pattern may have a width greater than that of the second insulation layer pattern. The upper recess may have a width greater than that of the lower recess.

In a method of manufacturing a recessed transistor in accordance with example embodiments, an isolation layer may be formed in a substrate to establish an active region and a field region of the substrate. An upper recess having a first width may be formed at (or on) a surface portion of the substrate in the active region. The substrate exposed through the upper recess may be partially etched to form a lower recess having a second width less than the first width and an active pin between the lower recess and the isolation layer, forming a recessed structure including the upper recess and the lower recess. A gate insulation layer may be formed on an inner surface of the recessed structure. A gate electrode may be formed on the gate insulation layer. Source/drain regions may be formed in the active region of the substrate.

According to example embodiments, forming the upper recess may include forming a pad insulation layer on the substrate, forming an insulation layer for a hard mask on the pad insulation layer, forming a photoresist pattern on the insulation layer for the hard mask and partially etching the insulation layer for the hard mask. The photoresist pattern may be used as an etching mask for the pad insulation layer and the substrate. Partially etching the insulation layer for the hard mask, the pad insulation layer and the substrate may be performed by performing an anisotropic etching process.

According to example embodiments, partially etching the substrate exposed through the upper recess may include forming a first spacer on a side surface of the upper recess and partially etching the substrate exposed through the lower recess using the first spacer as an etching mask. Forming the isolation layer may include forming a trench structure in the field region of the substrate, forming a curing layer on a side surface and a bottom surface of the trench structure, forming a field isolation layer in the trench structure and planarizing the curing layer and the field insulation layer until an upper surface of the substrate is exposed.

In a method of manufacturing a recessed transistor in accordance with example embodiments, an upper recess having a first width may be formed at a surface portion of the substrate. A lower recess, which is connected to (or in communication with) the upper recess and has a second width less than the first width, may be formed at the surface portion of the substrate. The upper recess and the lower recess may be filled with an isolation layer to establish (or define) an active region and a field region of the substrate. The substrate in the active region may be partially etched to form a recessed structure including the upper recess and the lower recess and an active pin between side surfaces of the lower recess and the isolation layer. A gate insulation layer may be formed on an inner surface of the recessed structure. A gate electrode may be formed on the gate insulation layer. Source/drain regions may be formed in the active region of the substrate.

According to example embodiments, the active pin may be formed between the side surfaces of the lower recess and the isolation layer to prevent (or reduce) the occurrence of a swing phenomenon, which may be caused by changing an effective charge density per unit channel length that varies according to a profile of a bottom surface in the lower recess. A channel may be formed along the gate insulation layer on the upper surface of the active pin and the side surface of the upper recess so that undesirable electrical characteristics of the recessed transistor caused by the profile of the lower recess may be suppressed. As such, the recessed transistor may have increase electrical characteristics.

BRIEF DESCRIPTION OF THE DRAWINGS

Example embodiments will be more clearly understood from the following detailed description taken in conjunction with the accompanying drawings. FIGS. 1-22C represent non-limiting, example embodiments as described herein.

FIG. 1 is a diagram illustrating a cross-sectional view of a conventional recessed gate structure;

FIG. 2 is a graph showing an effective charge density per unit gate length along a surface of a channel in the recessed gate structure in FIG. 1;

FIGS. 16C, 17C, 18C, 19C, 20C, 21C and 22C are diagram illustrating cross-sectional views taken along lines II-II' in FIGS. 16A, 17A, 18A, 19A, 20A, 21A and 22A, respectively.

DETAILED DESCRIPTION OF EXAMPLE EMBODIMENTS

Figure 1:
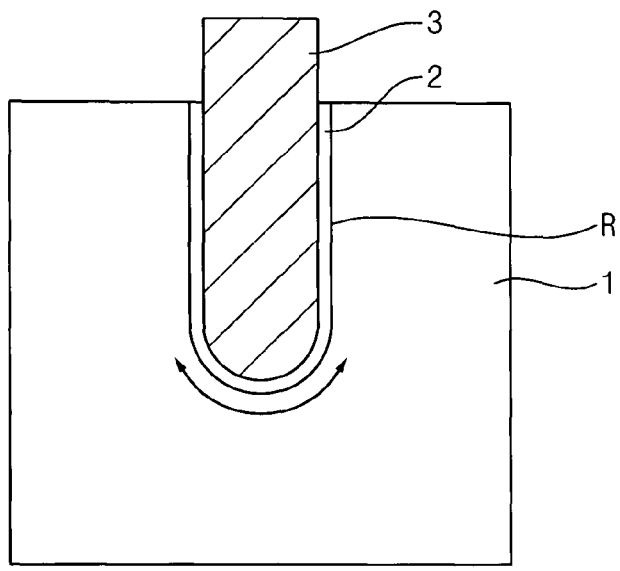
Figure 2:
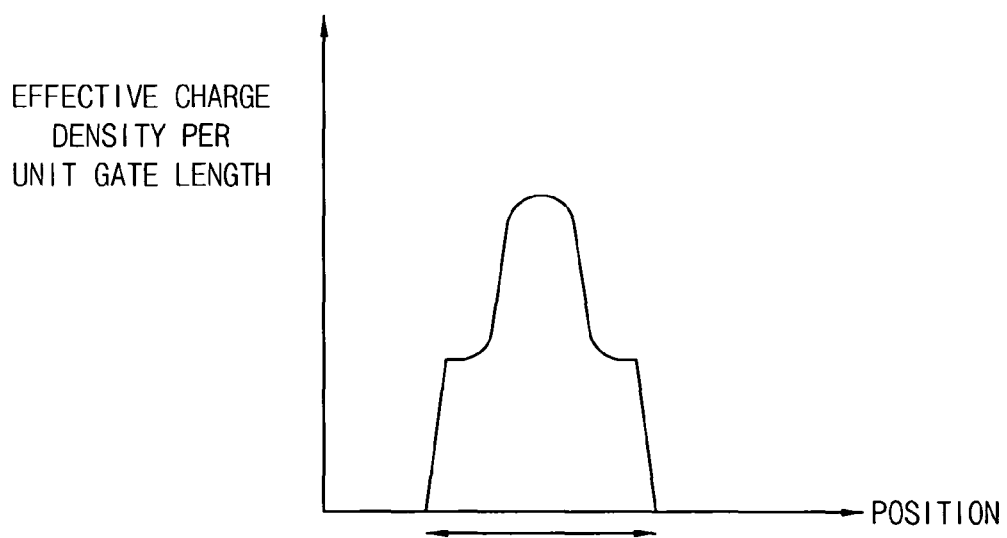

Various example embodiments will now be described more fully with reference to the accompanying drawings in which some example embodiments are shown. In the drawings, the thickness of layers and regions may be exaggerated for clarity.

Detailed illustrative embodiments are disclosed herein. However, specwhenic structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modwhenications and alternative forms, embodiments thereof are shown by way of example in the drawings and will herein be described in detail. It should be understood, however, that there is no intent to limit example embodiments to the particular forms disclosed, but on the contrary, example embodiments are to cover all modwhenications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, when the device in the figures is turned over, elements described as "below" or "beneath" other elements or features would then be oriented "above" the other elements or features. Thus, for example, the term "below" can encompass both an orientation that is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a recessed transistor and a method of manufacturing the same. Other example embodiments relate to a recessed transistor including a gate structure that is formed in a recessed structure of an active region and a method of manufacturing the recessed transistor.

Figure 3A:
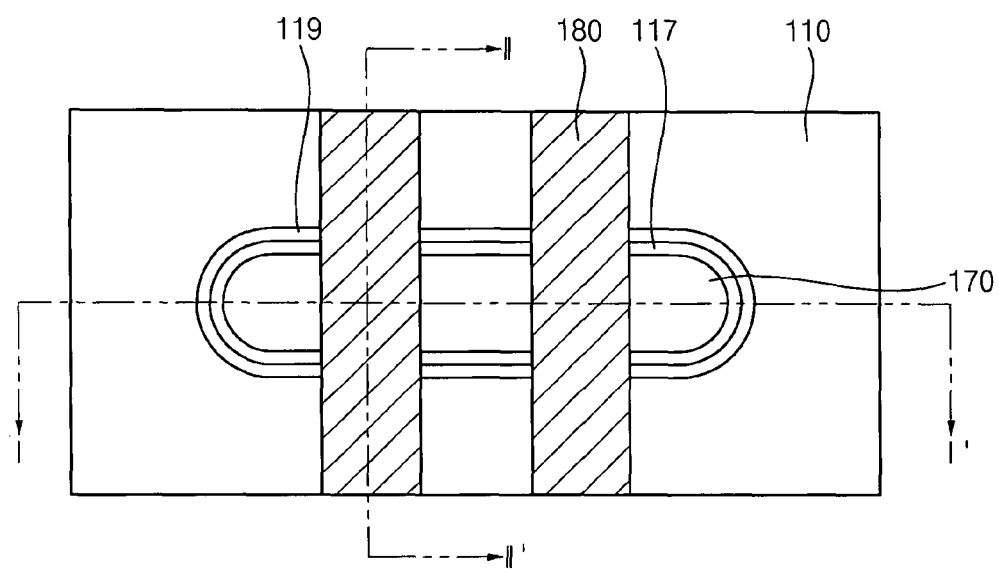
FIG. 3A is a diagram illustrating a plan view of a recessed transistor according to example embodiments.
Figure 3B:
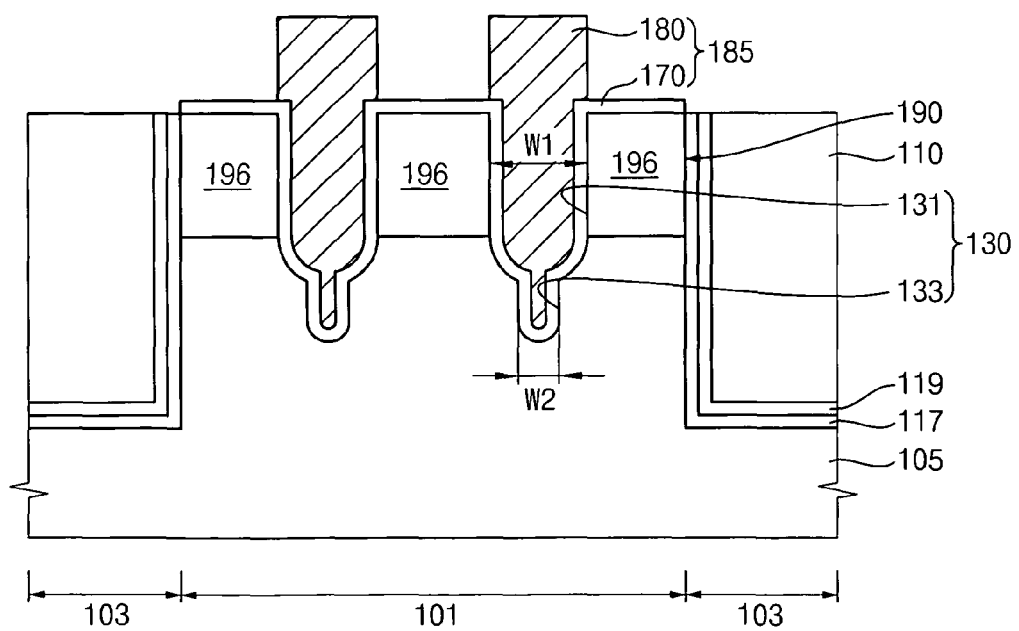
FIG. 3B is a diagram illustrating a cross-sectional view taken along a line I-I' in FIG. 3A.
Figure 3C:
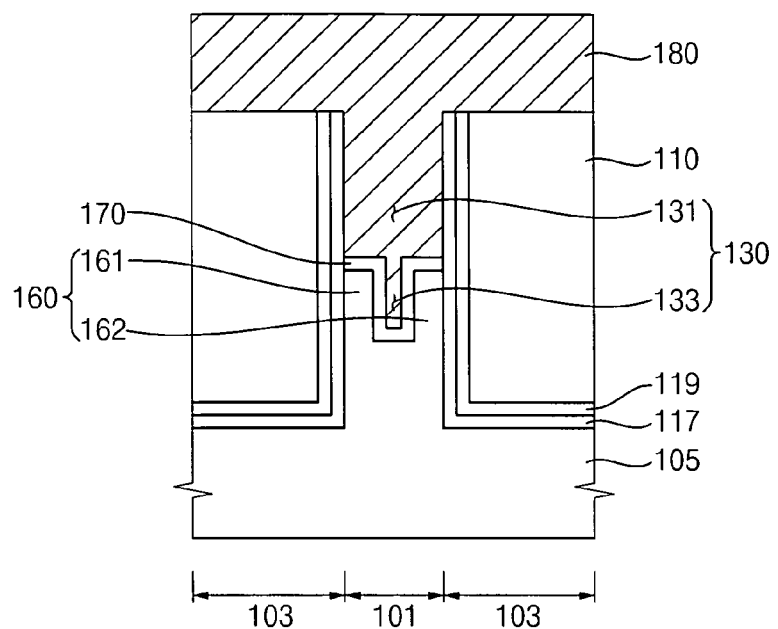
FIG. 3C is a diagram illustrating a cross-sectional view taken along a line II-II' in FIG. 3A.

FIG. 3A is a diagram illustrating a plan view of a recessed transistor in accordance with example embodiments. FIG. 3B is a diagram illustrating a cross-sectional view taken along a line I-I' in FIG. 3A. FIG. 3C is a diagram illustrating a cross-sectional view taken along a line II-II' in FIG. 3A.

Referring to FIGS. 3A to 3C, a recessed transistor 100 includes a substrate 105 having a recessed structure 130, an active pin 160, a gate insulation layer 170, a gate electrode 180 and source/drain regions 196.

The substrate 105 may include a semiconductor substrate (e.g., a silicon-on-insulator (SOI) substrate, a germanium-on-insulator (GOI) substrate or the like).

An isolation layer 110 may be formed on the substrate 105. The isolation layer 110 may separate (or distinguish) the substrate 105 into an active region 101 and a field region 103. A region where the isolation layer 110 is formed may be established as the field region 103. A region surrounded by the isolation layer 110 may be established as the active region 101. The isolation layer 110 may include silicon oxide.

According to example embodiments, the isolation layer 110 may be formed by a shallow trench isolation (STI) process. When the isolation layer 110 is formed by the STI process, a curing layer 117 may be formed on an inner surface of a trench 190 in order to cure (or repair) damages to the substrate 105 generated from a trench 190 formed in a surface portion of the substrate 105. The curing layer 117 may include a thermal oxidation layer. A liner layer 119 may be formed between the curing layer 117 and the isolation layer 110. The liner layer 119 may suppress (or prevent) impurities (e.g., carbon atoms or hydrogen atoms) in the isolation layer 110 from diffusing into the active region 101 of the substrate 105.

The recessed structure 130 may be formed in the active region 101 of the substrate 105. The recessed structure 130 includes an upper recess 131 and a lower recess 133 connected to (or in communication with) the upper recess 131.

The upper recess 131 may have a side surface having a profile substantially perpendicular to an upper surface of the substrate 105. When the substrate 105 includes a silicon wafer, silicon between side surfaces of the upper recess 131 and the isolation layer 110 may be more easily removed.

The upper recess 131 may have a first width, $w_1$. The lower recess 133 may have a second width, $w_2$. The first width of the upper recess 131 may be wider than the second width of the lower recess 133.

The active pin 160 may be formed between side surfaces of the isolation layer 110 and the lower recess 133. When the first width $w_1$ of the upper recess 131 is wider than the second width $w_2$ of the lower recess 133, the active pin 160 may surround the side surface of the lower recess 133.

The active pin 160 may include a first active pin portion 161 and a second active pin portion 162 arranged adjacent to an interface between the active region 101 and the field region 103 along a vertical (or extending) direction of the gate electrode 180. The gate insulation layer 170 may be formed on a portion of the active pin 160 between the side surfaces of the isolation layer 110 and the lower recess 133.

The gate insulation layer 170 may be formed on an upper surface of the recessed structure 130 and the substrate 105. The gate insulation layer 170 extends from the upper surface of the recessed structure 130 to the upper surface of the substrate 105. The gate insulation layer 170 may be formed on the side surface of the upper recess 131 and the upper surface, the side face and the bottom surface of the lower recess 133.

The gate insulation layer 170 may include oxide or metal oxide having a substantially high dielectric constant. The gate insulation layer 170 may include silicon oxide (SiO$_2$), hafnium oxide (HfO$_2$), tantalum oxide (Ta$_2$O$_5$), zirconium oxide (ZrO$_2$), titanium oxide (TiO$_2$), aluminum oxide (Al$_2$O$_3$) or similar compounds.

The gate insulation layer 170 may have a first thickness measured from the upper surface of the recessed structure 130. The first thickness of the gate insulation layer 170 may be about 50 Å to about 100 Å from the upper surface of the recessed structure 130.

When a voltage greater than or equal to a threshold voltage is applied to the gate electrode 180, a channel may be formed in the gate insulation layer 170. The channel may include a first channel passage and a second channel passage. The first channel passage may be formed in a portion of the gate insulation layer 170 on the side surface of the upper recess 131 and the upper surface of the active pin 160. The second channel passage may be formed in a portion of the gate insulation layer 170 on the side surface of the upper recess 131 and the side surface and the bottom surface of the lower recess 133. Because the first channel passage is shorter than the second channel passage, the first channel passage function as a channel compared to the second channel passage. In the channel including the first channel passage and the second channel passage, an effective charge density per unit length (which represents an accumulation degree of a charge along the gate insulation layer 170) may be influenced by a profile of the lower recess 133. As such, the channel formed along the first channel passage may be influenced by the profile of the lower recess 133 such that the recessed transistor 100 may have desirable swing characteristics.

The gate electrode 180 may be formed on the gate insulation layer 170 in the recessed structure 130. A gate pattern 185 including the gate insulation layer 170 and the gate electrode 180 may be formed.

The gate electrode 180 may include polysilicon doped with impurities. Examples of the impurities may include tungsten (W), aluminum (Al), titanium (Ti), tantalum (Ta), copper (Cu) or similar elements.

The gate electrode 180 may include a metal layer pattern. The metal layer pattern may include tungsten (W), aluminum (Al), titanium (Ti), tantalum (Ta), copper (Cu) or similar elements. The gate electrode 180 may have a polycide structure including polysilicon doped with impurities and metal silicide.

The source/drain regions 196 may be arranged in the active region 101 of the substrate 105 adjacent to the gate electrode 180. The source/drain regions 196 may include a conductive material. Examples of the conductive material may include elements in Group V (e.g., indium, arsenic, antimony or the like) or elements in Group III (e.g., aluminum, gallium, phosphorous or the like).

According to example embodiments, the channel of the recessed transistor 100 may be formed on the active pin 160 between the side surfaces of the isolation layer 110 and the lower recess 133 such that electrical characteristics of the recessed transistor 100 may be unaffected by the profile of the lower recess 133.

Figure 4A:
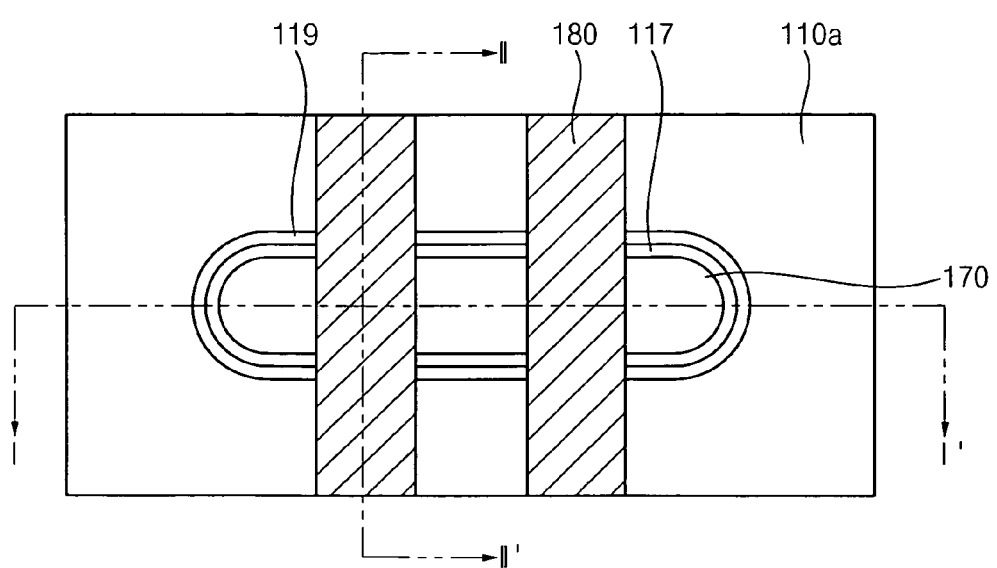
FIG. 4A is a diagram illustrating a plan view of a recessed transistor in according to example embodiments.
Figure 4B:
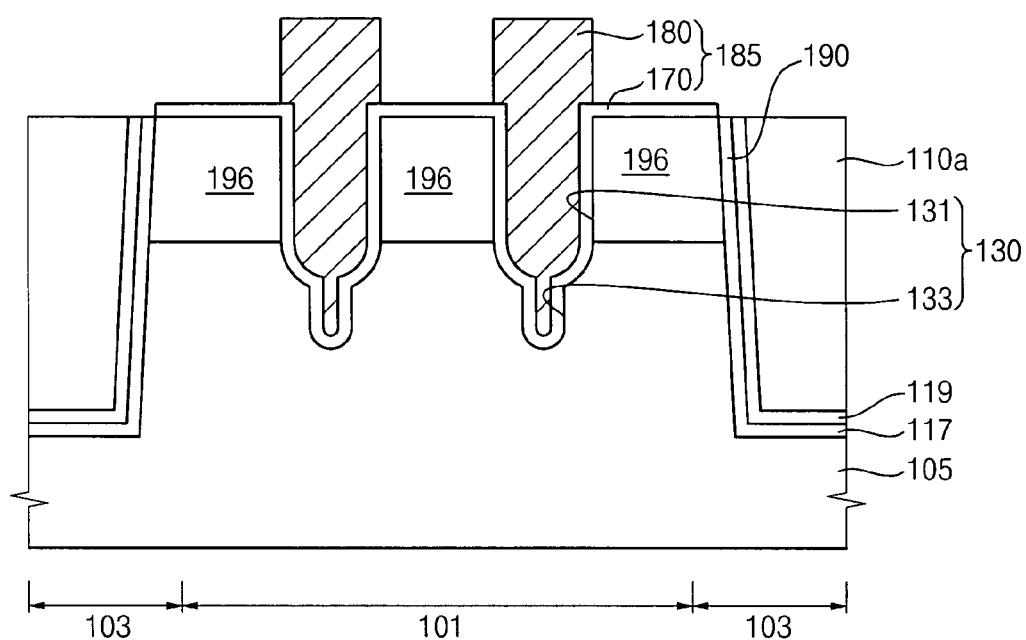
FIG. 4B is a diagram illustrating a cross-sectional view taken along a line I-I' in FIG. 4A.
Figure 4C:
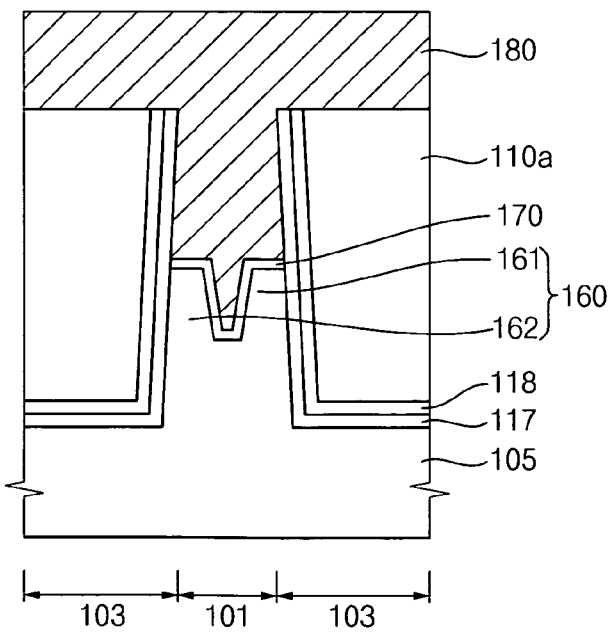
FIG. 4C is a diagram illustrating a cross-sectional view taken along a line II-II' in FIG. 4A.

FIG. 4A is a diagram illustrating a plan view of a recessed transistor in accordance with example embodiments. FIG. 4B is a diagram illustrating a cross-sectional view taken along a line I-I' in FIG. 4A. FIG. 4C is a diagram illustrating a cross-sectional view taken along a line II-II' in FIG. 4A.

The recessed transistor 100a includes elements substantially the same as those of the recessed transistor 100 in FIGS. 3A to 3C. Thus, where the reference numerals in FIGS. 4A to 4C refer to like elements in FIGS. 3A to 3C, any further explanation thereof will be omitted for the sake of brevity.

Referring to FIGS. 4A to 4C, a recessed transistor 100a may include a substrate 105 having a recessed structure 130, an active pine 160, a gate pattern 185 and/or source and drain regions 196.

The substrate 105 may include a semiconductor substrate (e.g., a silicon-on-insulator (SOI) substrate, a germanium-on-insulator (GOI) substrate or the like).

An isolation layer 110a may be formed in the substrate 105. The isolation layer 110a may separate (or differentiate) the substrate 105 into an active region 101 and a field region 103. A region where the isolation layer 110a is formed may be established as the field region 103. A region surrounded by the isolation layer 110a may be established as the active region 101. The isolation layer 110a may include silicon oxide.

The isolation layer 110a may be formed by a shallow trench isolation (STI) process. When the isolation layer 110a is formed by the STI process, a curing layer 117 may be formed on an inner surface of a trench 190 in order to repair damage to the substrate 105 generated during the formation of the trench 190 in a surface portion of the substrate 105. The curing layer 117 may include a thermal oxidation layer. A liner layer 119 may be formed between the curing layer 117 and the isolation layer 110a. The liner layer 119 may suppress (or prevent) impurities (e.g., carbon atoms or hydrogen atoms) in the isolation layer 110a from diffusing into the active region 101 of the substrate 105.

The isolation layer 110a may include a side surface having a cross-sectional area that gradually enlarges toward the upper surface of the substrate 105. The active pin 160 interposed between the side surfaces of the lower recess 133 and the isolation layer 110a may have a desirable width. As such, the gate insulation layer 170 on the active pin 160 may have a desirable channel length.

The recessed structure 130 may be formed in the active region 101 of the substrate 105. The recessed structure 130 includes an upper recess 131 and a lower recess 133 connected to (or in communication with) the upper recess 131.

The upper recess 131 may have a side surface corresponding to the side surface of the isolation layer 110a. The substrate 105 in the active region between side surfaces of the upper recess 131 and the isolation layer 110a may be more easily removed.

The active pin 160 may be formed between side surfaces of the isolation layer 110a and the lower recess 133. The active pin 160 may surround the side surface of the lower recess 133.

The active pin 160 may include a first active pin portion 161 and a second active pin portion 162 arranged adjacent to both ends of the isolation layer 110a along an extension direction of the gate electrode 180. A channel may be formed in the gate insulation layer 170 on the active pin 160 between the side surfaces of the isolation layer 110a and the lower recess 133.

The gate insulation layer 170 may be formed on upper surfaces of the recessed structure 130 and the substrate 105. The gate insulation layer 170 extends from the upper surface of the recessed structure 130 to the upper surface of the substrate 105. The gate insulation layer 170 may be formed on the side surface of the upper recess 131 and the upper surface, the side surface and the bottom surface of the lower recess 133.

The gate insulation layer 170 may include oxide or metal oxide having a substantially high dielectric constant. The gate insulation layer 170 may include silicon oxide ($SiO_2$), hafnium oxide ($HfO_2$), tantalum oxide ($Ta_2O_5$), zirconium oxide ($ZrO_2$), titanium oxide ($TiO_2$), aluminum oxide ($Al_2O_3$) combinations thereof or similar compounds.

The gate insulation layer 170 may have a first thickness measured from the upper surface of the recessed structure 130. The first thickness of the gate insulation layer 170 may be about 50 Å to about 100 Å from the upper surface of the recessed structure 130.

When a voltage greater than or equal to a threshold voltage is applied to the gate electrode 180, a channel may be formed in the gate insulation layer 170. The channel may include a first channel passage and a second channel passage. The first channel passage may be formed in a portion of the gate insulation layer 170 on the side surface of the upper recess 131 and the upper surface of the active pin 160. The second channel passage may be formed in a portion of the gate insulation layer 170 on the side surface of the upper recess 131 and the side surface and the bottom surface of the lower recess 133. Because the first channel passage is shorter than the second channel passage, the first channel passage may function as a channel compared to the second channel passage. In the channel including the first channel passage and the second channel passage, an effective charge density per unit length (which represents the accumulation degree of a charge along the gate insulation layer 170) may be influenced by a profile of the lower recess 133. As such, the channel formed along the first channel passage may be influenced by the profile of the lower recess 133 such that the recessed transistor 100a may have increased (or desirable) swing characteristics.

The gate electrode 180 may be formed on the gate insulation layer 170 in the recessed structure 130. A gate pattern 185 including the gate insulation layer 170 and the gate electrode 180 may be formed.

The gate electrode 180 may include polysilicon doped with impurities. Examples of the impurities may include tungsten (W), aluminum (Al), titanium (Ti), tantalum (Ta), copper (Cu) or like elements.

The gate electrode 180 may include a metal layer pattern. The metal layer pattern may include tungsten (W), aluminum (Al), titanium (Ti), tantalum (Ta), copper (Cu) or like elements. The gate electrode 180 may have a polycide structure including polysilicon doped with impurities and metal silicide.

The source/drain regions 196 may be arranged in the active region 101 of the substrate 105 adjacent to the gate electrode 180. The source/drain regions 196 may include a conductive material. Examples of the conductive material may include elements in Group V (e.g., indium, arsenic, antimony or the like) or elements in Group III (e.g., aluminum, gallium, phosphorous or the like).

According to example embodiments, the channel of the recessed transistor 100a may be formed on the active pin 160 between the side surfaces of the isolation layer 110a and the lower recess 133 such that electrical characteristics of the recessed transistor 100a are unaffected by the profile of the lower recess 133.

Figure 5A:
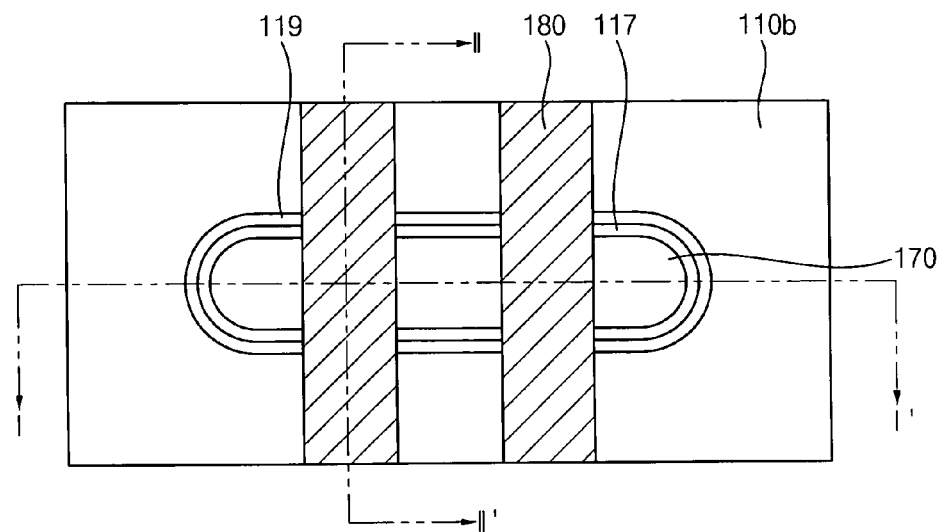
FIG. 5A is a diagram illustrating a plan view of a recessed transistor according to example embodiments.
Figure 5B:
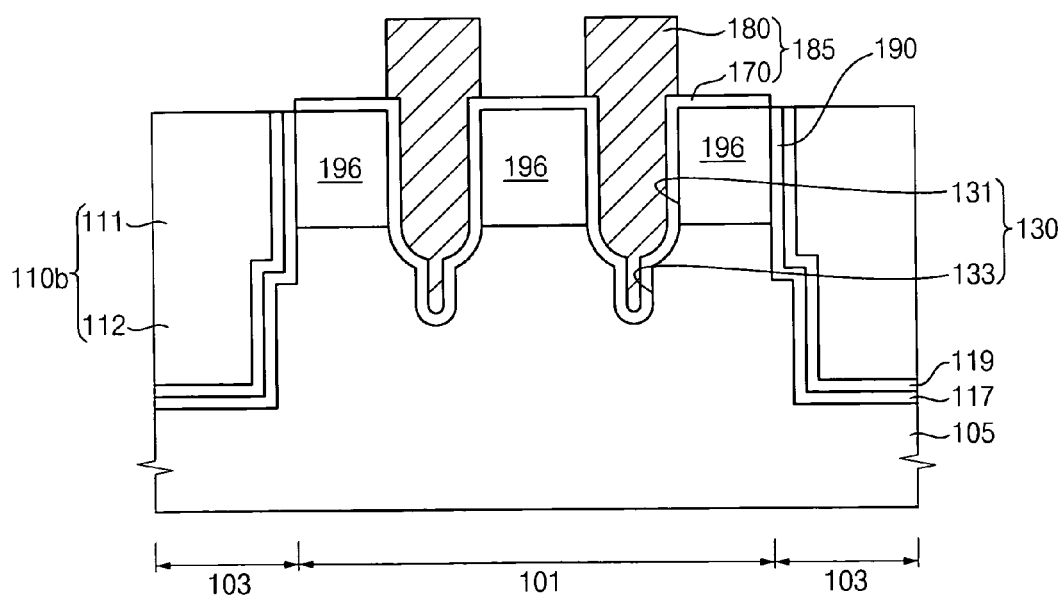
FIG. 5B is a diagram illustrating a cross-sectional view taken along a line I-I' in FIG. 5A.
Figure 5C:
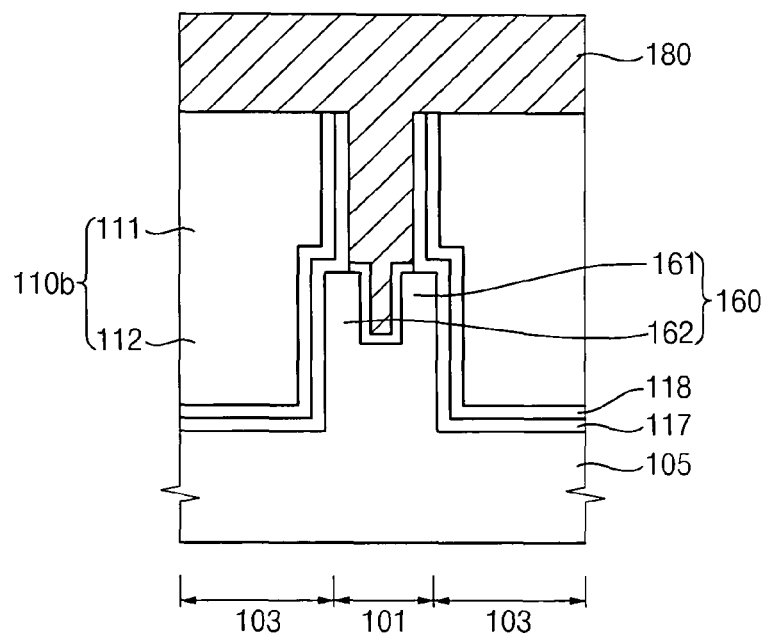
FIG. 5C is a diagram illustrating a cross-sectional view taken along a line II-II' in FIG. 5A.

FIG. 5A is a diagram illustrating a plan view of a recessed transistor in accordance with example embodiments. FIG. 5B is a diagram illustrating a cross-sectional view taken along a line I-I' in FIG. 5A. FIG. 5C is a diagram illustrating a cross-sectional view taken along a line II-II' in FIG. 5A.

The recessed transistor 100b includes elements substantially the same as those of the recessed transistor 100 in FIGS. 3A to 3C. Thus, further explanation of reference numerals in FIGS. 5A 5C referring to like elements in FIGS. 3A to 3C will be omitted for the sake of brevity.

Referring to FIGS. 5A to 5C, a recessed transistor 100b includes a substrate 105, a recessed structure 130, an active pin 160, a gate pattern 185 and/or source and drain regions 196.

The substrate 105 may include a semiconductor substrate (e.g., a silicon-on-insulator (SOI) substrate, a germanium-on-insulator (GOI) substrate or the like).

An isolation layer 110b may be formed on the substrate 105. The isolation layer 110b may separate the substrate 105 into an active region 101 and a field region 103. A region where the isolation layer 110b is formed may be established as the field region 103. A region surrounded by the isolation layer 110b may be established as the active region 101. The isolation layer 110b may include silicon oxide.

The isolation layer 110b may be formed by a shallow trench isolation (STI) process. When the isolation layer 110b is formed by the STI process, a curing layer 117 may be formed on an inner surface of a trench 190 in order to repair damages to the substrate 105 generated when the trench 190 is formed in a surface portion of the substrate 105. The curing layer 117 may include a thermal oxidation layer.

A liner layer 119 may be formed between the curing layer 117 and the isolation layer 110a. The liner layer 119 may suppress (or prevent) impurities (e.g., carbon atoms or hydrogen atoms) in the isolation layer 110b from diffusing into the active region 101 of the substrate 105.

The isolation layer 110b may include a first insulation layer pattern 111 and a second insulation layer pattern 112 beneath the first insulation layer pattern 111. The first insulation layer pattern 111 may have a width greater than that of the second insulation layer pattern 112. The active region 101 established by the isolation layer 110b may have an upper portion having a first width and a lower portion having a second width greater than the first width. As such, the active pin 160 interposed between the side surfaces of the lower recess 133 and the second insulation layer pattern 112 of the isolation layer 110b may have a desirable width.

The recessed structure 130 may be formed in the active region 101 of the substrate 105. The recessed structure 130 includes an upper recess 131 and a lower recess 133 in communication with the upper recess 131.

The upper recess 131 may have a width substantially the same as that of the lower recess 133. Because the active region 101 may have an upper portion having a first width and a lower portion having a second width greater than the first width, the active pin 160 may be formed between the side surfaces of the lower recess 133 and the isolation layer 110b. The active pin 160 includes a first active pin portion 161 and a second active pin portion 162 arranged adjacent to both ends of the isolation layer 110b along an extension (or vertical) direction of the gate electrode 180. A channel may be formed in the gate insulation layer 170 on the active pin 160 between the side surfaces of the isolation layer 110b and the lower recess 133.

The gate insulation layer 170 may be formed on upper surfaces of the recessed structure 130 and the substrate 105. The gate insulation layer 170 extends from the upper surface of the recessed structure 130 to the upper surface of the substrate 105. The gate insulation layer 170 may be formed on the side surface of the upper recess 131 and the upper surface, the side surface and the bottom surface of the lower recess 133.

The gate insulation layer 170 may include oxide or metal oxide having a substantially high dielectric constant. The gate insulation layer 170 may include silicon oxide ($SiO_2$), hafnium oxide ($HfO_2$), tantalum oxide ($Ta_2O_5$), zirconium oxide ($ZrO_2$), titanium oxide ($TiO_2$), aluminum oxide ($Al_2O_3$) or similar compounds.

The gate insulation layer 170 may have a first thickness measured from the upper surface of the recessed structure 130. The first thickness of the gate insulation layer 170 may be about 50 Å to about 100 Å from the upper surface of the recessed structure 130.

When a voltage greater than or equal to a threshold voltage is applied to the gate electrode 180, a channel may be formed in the gate insulation layer 170. A first channel passage may be formed in a portion of the gate insulation layer 170 on the side surface of the upper recess 131 and the upper surface of the active pin 160. A second channel passage may be formed in a portion of the gate insulation layer 170 on the side surface of the upper recess 131 and the side surface and the bottom surface of the lower recess 133. Because the first channel passage is shorter than the second channel passage, the first channel passage may function as a channel compared to the second channel passage. In the channel including the first channel passage and the second channel passage, an effective charge density per unit length (which represents the accumulation degree of a charge along the gate insulation layer 170) may be influenced by a profile of the lower recess 133. As such, the channel formed along the first channel passage may be influenced by the profile of the lower recess 133 such that the recessed transistor 100b may have increased swing characteristics.

The gate electrode 180 may be formed on the gate insulation layer 170 in the recessed structure 130. A gate pattern 185 including the gate insulation layer 170 and the gate electrode 180 may be formed.

The gate electrode 180 may include polysilicon doped with impurities. Examples of the impurities may include tungsten (W), aluminum (Al), titanium (Ti), tantalum (Ta), copper (Cu) or like elements.

The gate electrode 180 may include a metal layer pattern. The metal layer pattern may include tungsten (W), aluminum (Al), titanium (Ti), tantalum (Ta), copper (Cu) or similar element. The gate electrode 180 may have a polycide structure including polysilicon doped with impurities and metal silicide.

The source/drain regions 196 may be arranged in the active region 101 of the substrate 105 adjacent to the gate electrode 180. The source/drain regions 196 may include a conductive material. Examples of the conductive material may include elements in Group V (e.g., indium, arsenic, antimony or the like) or elements in Group III (e.g., aluminum, gallium, phosphorous or the like).

According to example embodiments, the channel of the recessed transistor 100b may be formed on the active pin 160 between the side surfaces of the isolation layer 110b and the lower recess 133 such electrical characteristics of the recessed transistor 100b are unaffected by the profile of the lower recess 133.

FIGS. 6A, 7A, 8A, 9A, 10A, 11A, 12A, 13A, 14A and 15A are diagrams illustrating plan views of a method of manufacturing a recessed transistor in accordance with example embodiments. FIGS. 6B, 7B, 8B, 9B, 10B, 11B, 12B, 13B, 14B and 15B are diagrams illustrating cross-sectional views taken along lines I-I' in FIGS. 6A, 7A, 8A, 9A, 10A, 11A, 12A, 13A, 14A and 15A, respectively. FIGS. 6C, 7C, 8C, 9C, 10C, 11C, 12C, 13C, 14C and 15C are diagrams illustrating cross-sectional views taken along lines II-II' in FIGS. 6A, 7A, 8A, 9A, 10A, 11A, 12A, 13A, 14A and 15A, respectively.

Figure 6A:
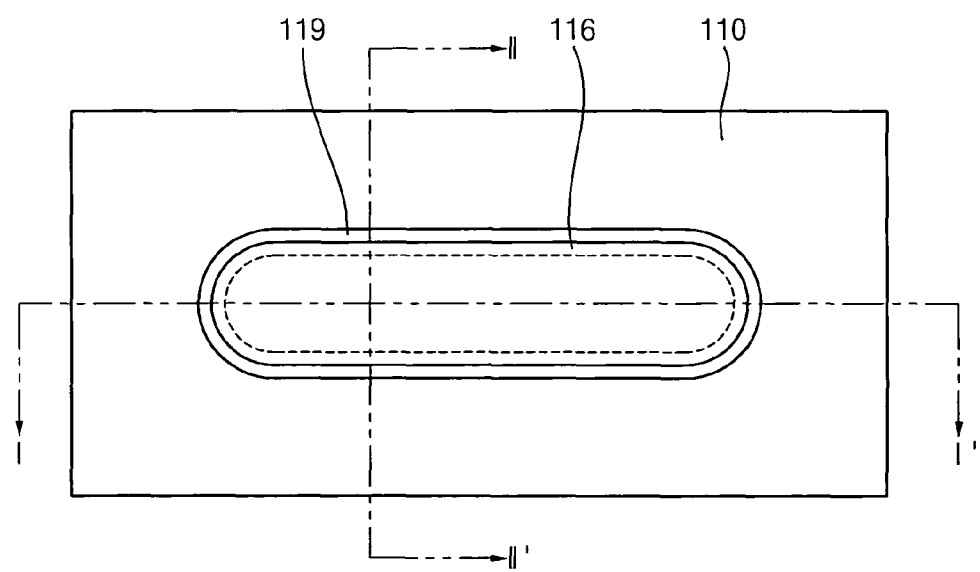
FIGS. 6A, 7A, 8A, 9A, 10A, 11A, 12A, 13A, 14A and 15A are diagrams illustrating plan views of a method of manufacturing a recessed transistor according to example embodiments.
Figure 6B:
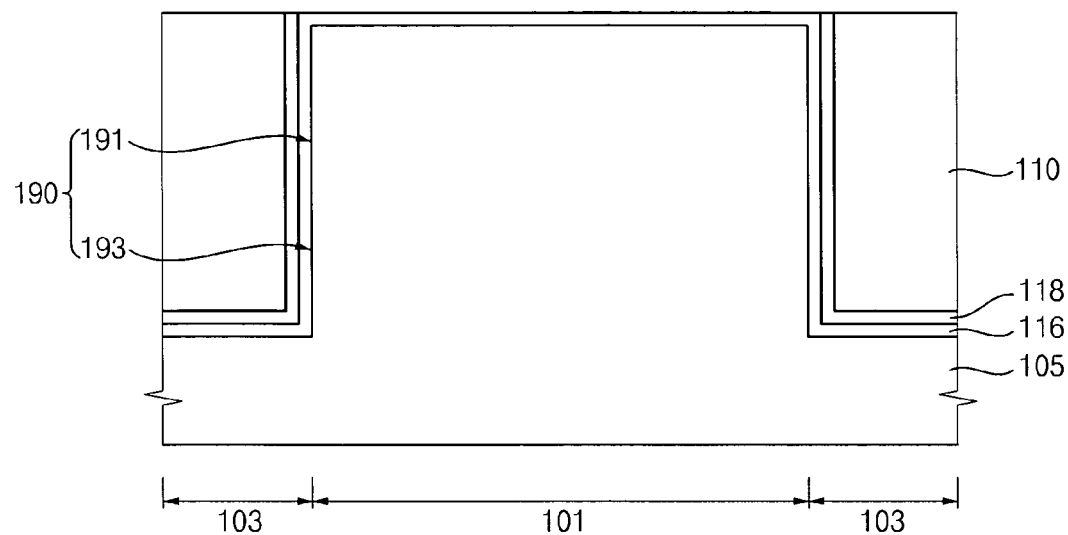
FIGS. 6B, 7B, 8B, 9B, 10B, 11B, 12B, 13B, 14B and 15B are diagrams illustrating cross-sectional views taken along lines I-I' in FIGS. 6A, 7A, 8A, 9A, 10A, 11A, 12A, 13A, 14A and 15A, respectively.
Figure 6C:
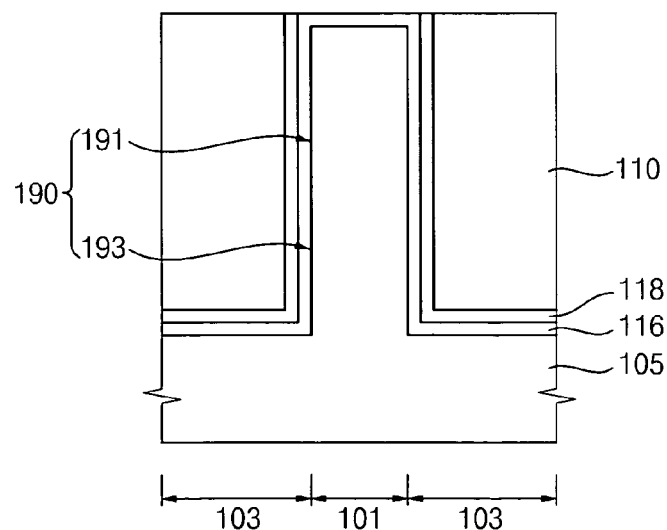
FIGS. 6C, 7C, 8C, 9C, 10C, 11C, 12C, 13C, 14C and 15C are diagrams illustrating cross-sectional views taken along lines II-II' in FIGS. 6A, 7A, 8A, 9A, 10A, 11A, 12A, 13A, 14A and 15A, respectively.

Referring to FIGS. 6A to 6C, an isolation layer 110 may be formed in a semiconductor substrate 105 by an isolation process to establish an active region 101 and a field region 103 of the substrate 105. The isolation layer 110 including oxide may be formed by an STI process. A first photoresist pattern (not shown) may be formed on the substrate 105. A trench structure 190 may be formed in the substrate 105 using the first photoresist pattern.

The trench structure 190 may have a side surface substantially perpendicular to an upper surface of the substrate 105. The trench structure 190 may have the side surface substantially perpendicular to the upper surface of the substrate 105.

An upper trench 191 may be formed at a surface portion of the substrate 105. The upper trench 191 may have a side surface substantially perpendicular to the upper surface of the substrate 105. The substrate 105 exposed through a bottom surface of the upper trench 191 may be etched to form a lower trench 193 substantially perpendicular to the upper surface of the substrate 105. As such, the trench structure 190 including the upper trench 191 and the lower trench 193 may be formed.

The first photoresist pattern may be removed by an ashing process and/or a stripping process. A curing layer 116 may be formed on a side surface and a bottom surface of the trench structure 190. The curing layer 116 may repair damage to the substrate 105 caused by collisions of ions having substantially high energy. The curing layer 116 may be formed by a thermal oxidation process.

To prevent (or reduce) impurities in the isolation layer 110 from diffusing into the active region 101, a liner layer 118 may be formed on the curing layer 116. The liner layer 118 may include silicon nitride. The liner layer 118 may have a thickness of about 50 Å to about 100 Å.

A field isolation layer (not shown) may be formed on the substrate 105 and in the trench structure 190. The field isolation layer may include undoped silicate glass (USG), tetraethyl orthosilicate (TEOS), high density plasma (HDP) oxide or the like. When the field isolation layer may include the HDP oxide, the field insulation layer may be formed using a plasma source including a silane gas, an oxygen gas and/or an argon gas.

The field insulation layer may be planarized until an upper surface of the curing layer 116 in the active region is exposed to form an isolation layer 110 in the trench structure 190. The field isolation layer may be planarized by a chemical mechanical polishing (CMP) process and/or an etch-back process.

Figure 7A:
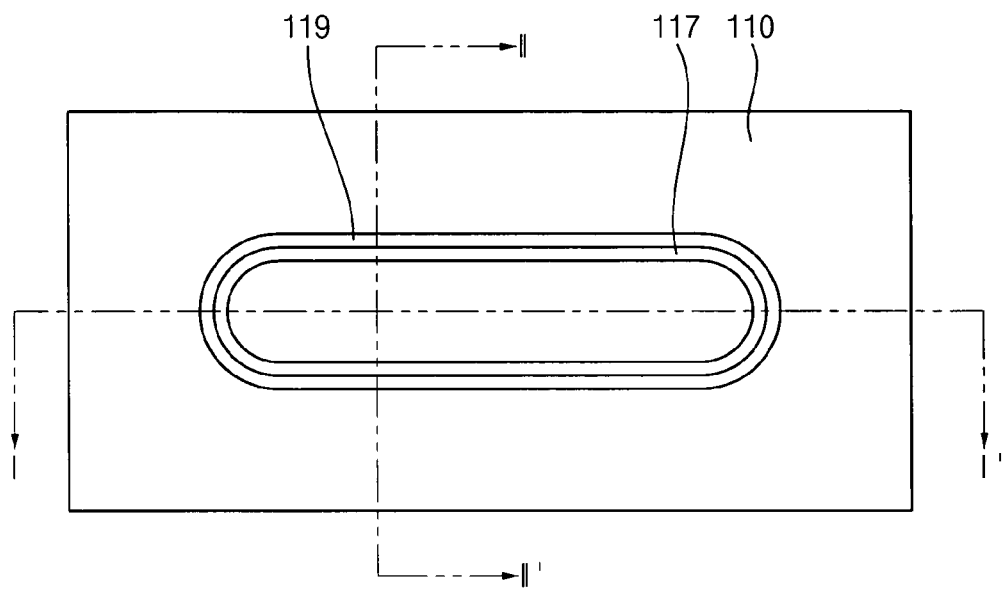
Figure 7B:
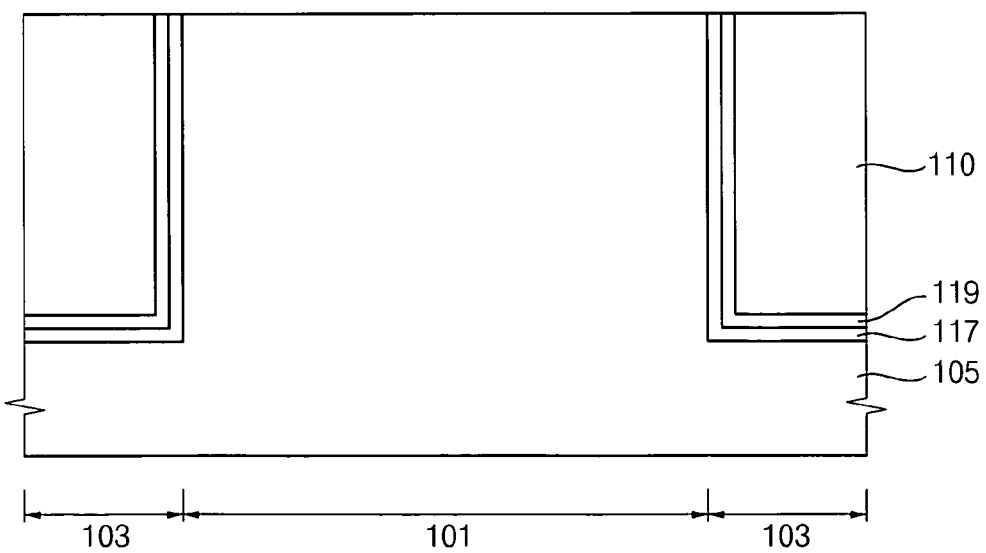
Figure 7C:
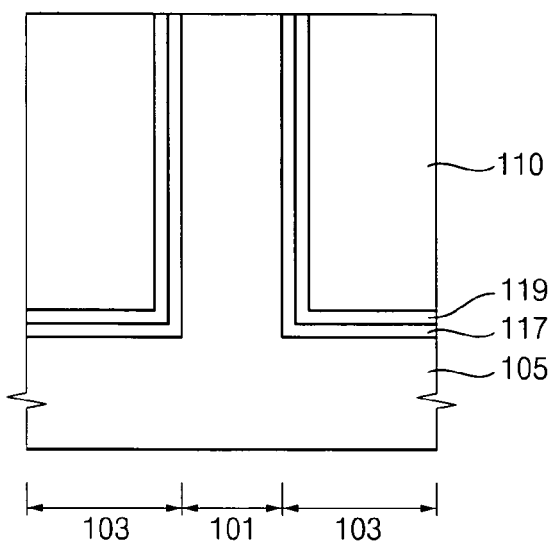

Referring to FIGS. 7A to 7C, exposed portions of the curing layer 118 and the liner layer 116 may be removed to form a curing layer pattern 119 and a liner layer pattern 117. The curing layer 118 and the liner layer 116 may be removed by a stripping process. A curing layer 118 and a liner layer 116 may be removed simultaneously by the planarization process until the upper surface of the substrate 105 is exposed.

Figure 8A:
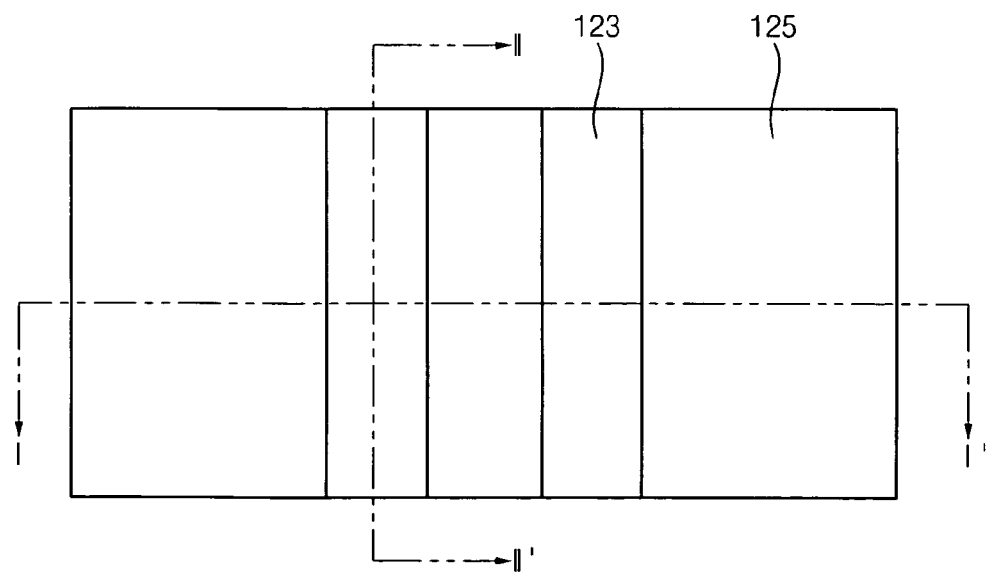
Figure 8B:
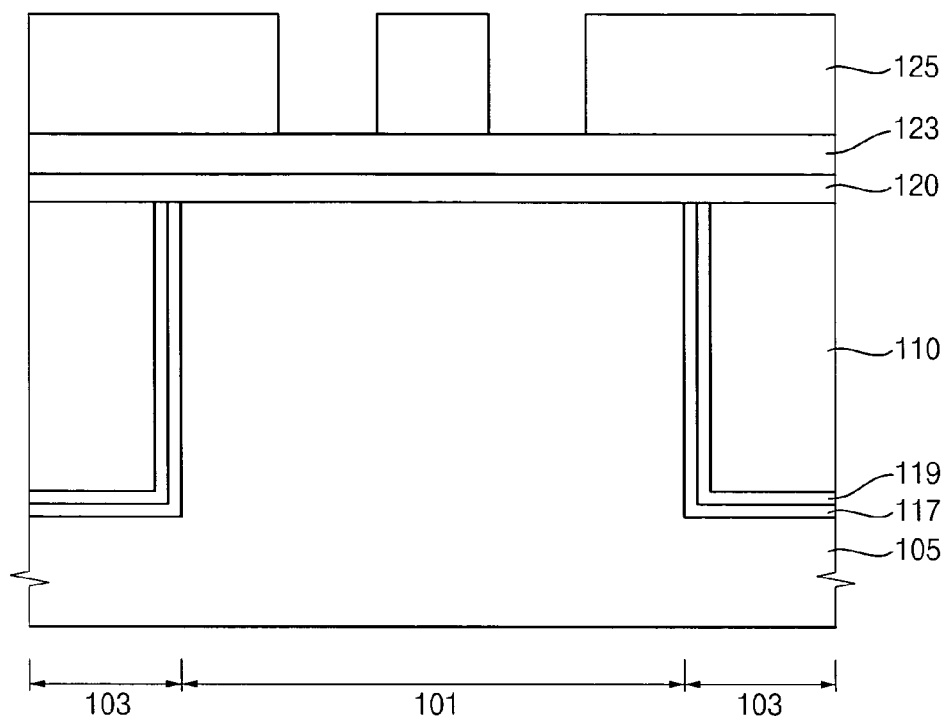
Figure 8C:
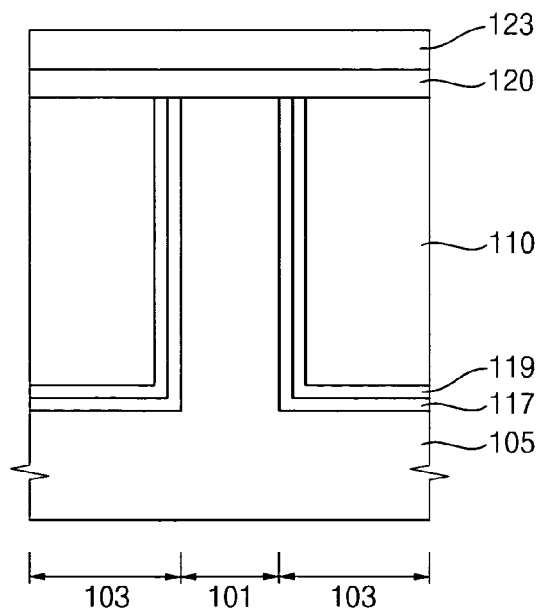

Referring to FIGS. 8A to 8C, a pad insulation layer 120 and a hard mask layer 123 may be sequentially formed on the substrate 105.

The pad insulation layer 120 may be formed by a thermal oxidation process, a chemical vapor deposition (CVD) process, a HDP-CVD process or a similar process.

The hard mask layer 123 may include a material having an etching selectivity with respect to the substrate 105 and the pad insulation layer 120. The hard mask layer 123 may include nitride (e.g., silicon nitride, oxynitride (silicon oxynitride and titanium oxynitride) or the like). The hard mask layer 123 may be a CVD process, a plasma-enhanced chemical vapor deposition (PECVD) process, an atomic layer deposition (ALD) process, a sputtering process, a pulse laser deposition (PLD) process or a similar process.

A second photoresist pattern 125 may be formed on the hard mask layer 123. The second photoresist pattern 125 partially exposes the hard mask layer 123.

Figure 9A:
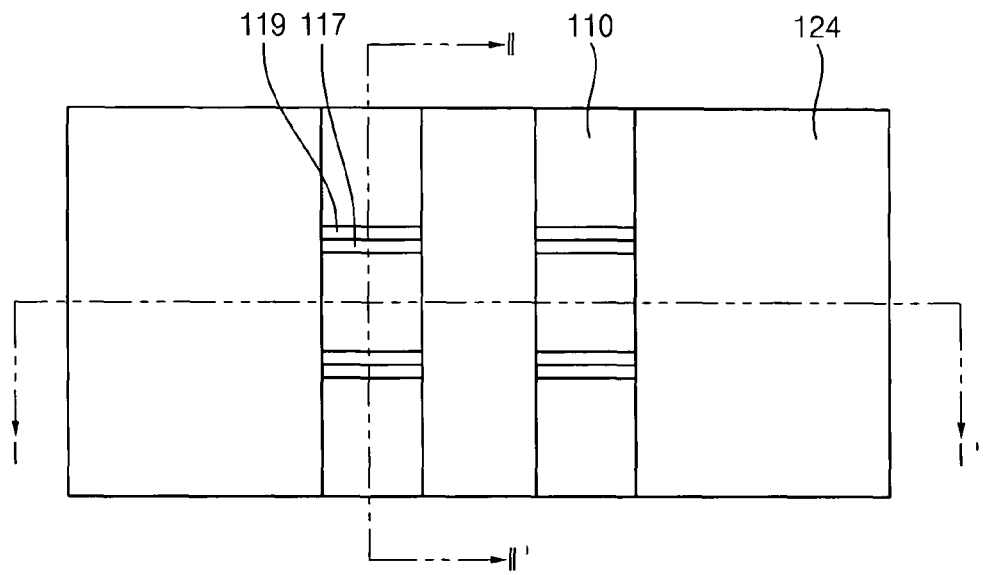
Figure 9B:
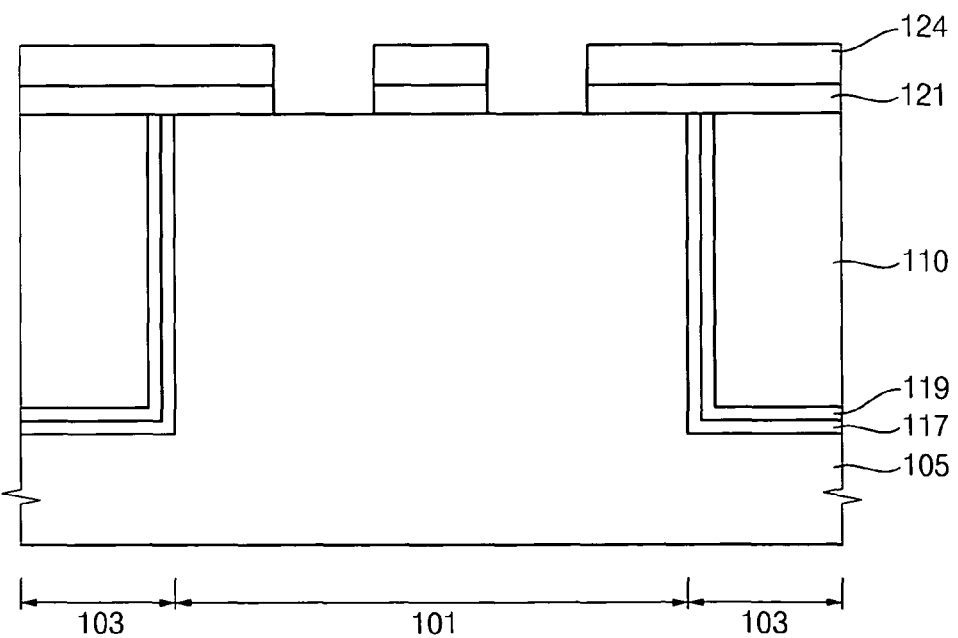
Figure 9C:
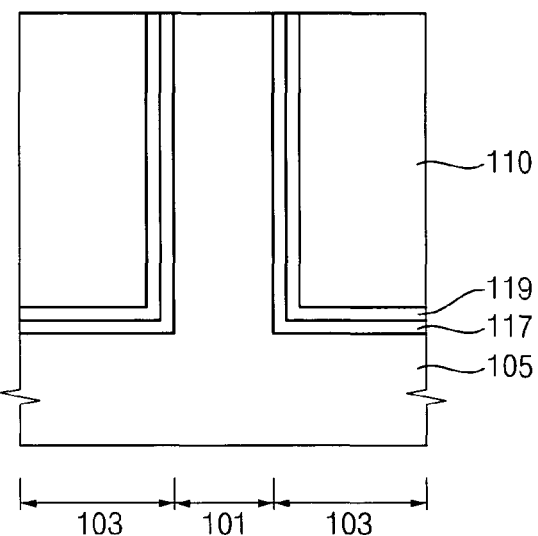

Referring to FIGS. 9A to 9C, the hard mask layer 123 may be partially etched using the second photoresist pattern 125 as an etching mask to form a hard mask pattern 124 on the pad insulation layer 120. The second photoresist pattern 125 may be removed by an ashing process and/or a stripping process.

The pad insulation layer 120 may be partially etched using the hard mask pattern 124 as an etching mask to form a pad insulation layer pattern 121 on the substrate 105.

Figure 10A:
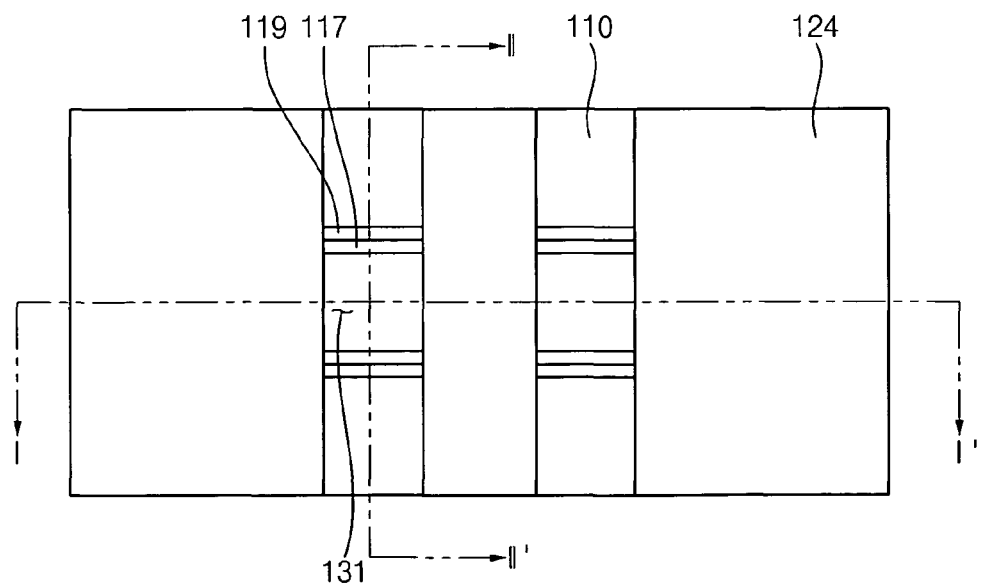
Figure 10B:
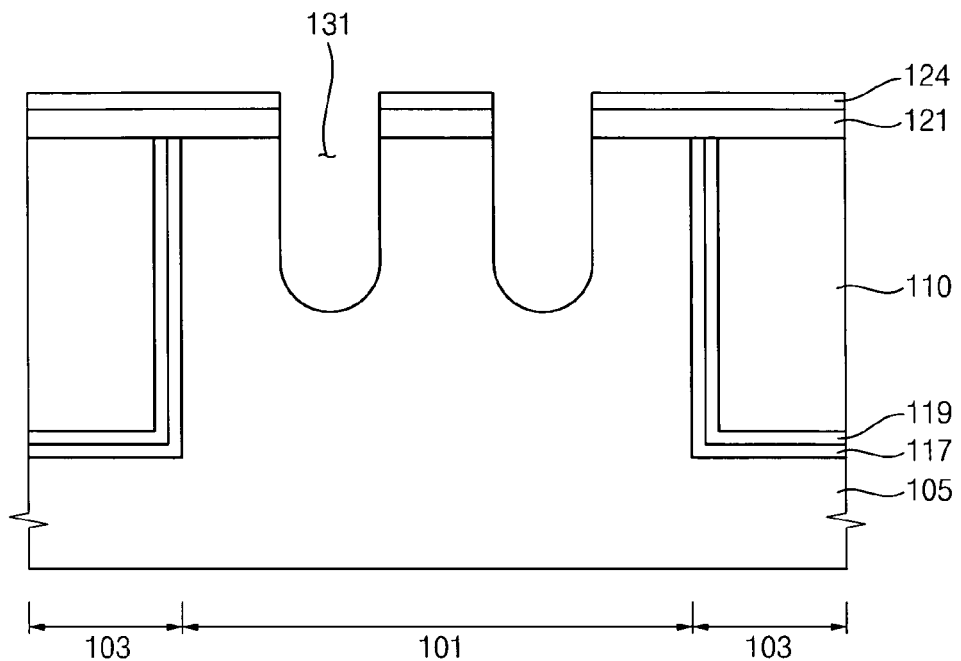
Figure 10C:
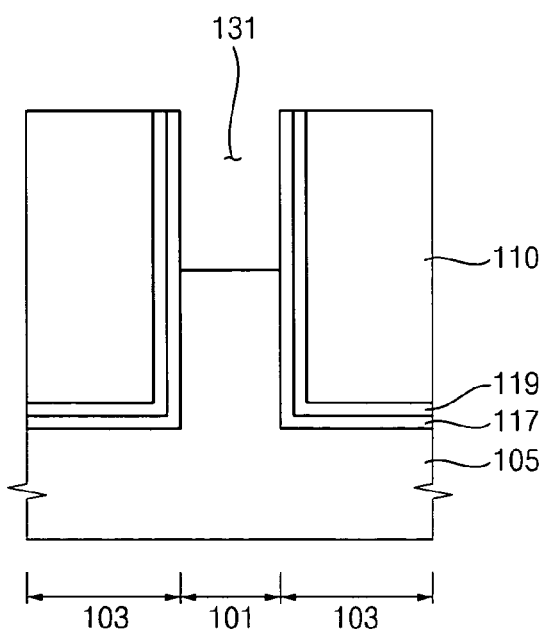

Referring to FIGS. 10A to 10C, a primary etching process may be performed on the substrate 105 using the hard mask pattern 124 and the pad insulation layer pattern 121 as an etching mask to form an upper recess 131 at a surface portion of the substrate 105. The primary etching process may include an anisotropic etching process. The upper recess 131 may have a first width. The first width of the upper recess 131 may be about 500 Å to about 700 Å. The upper recess 131 has a side surface substantially perpendicular to the upper surface of the substrate 105.

Figure 11A:
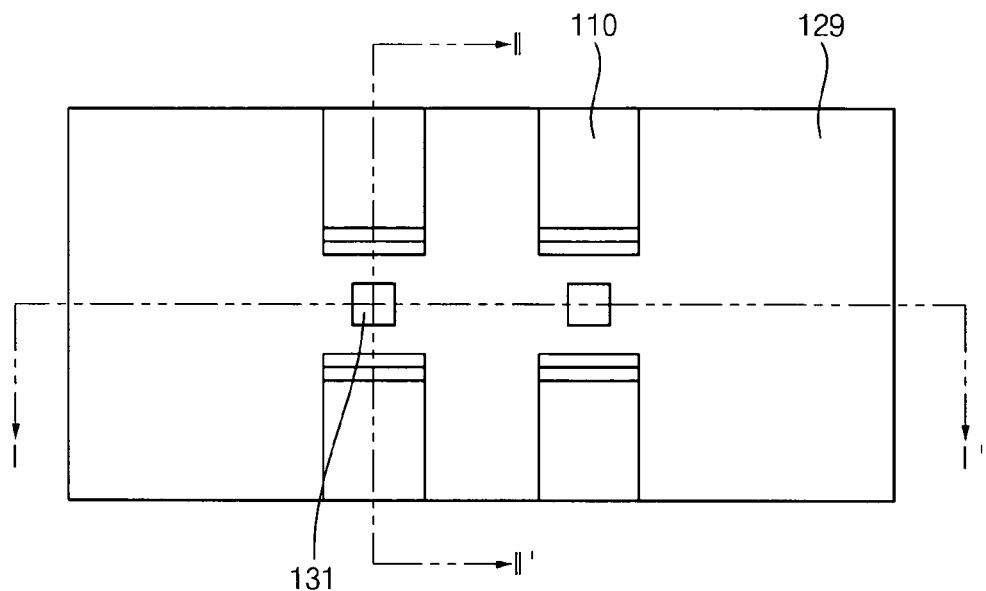
Figure 11B:
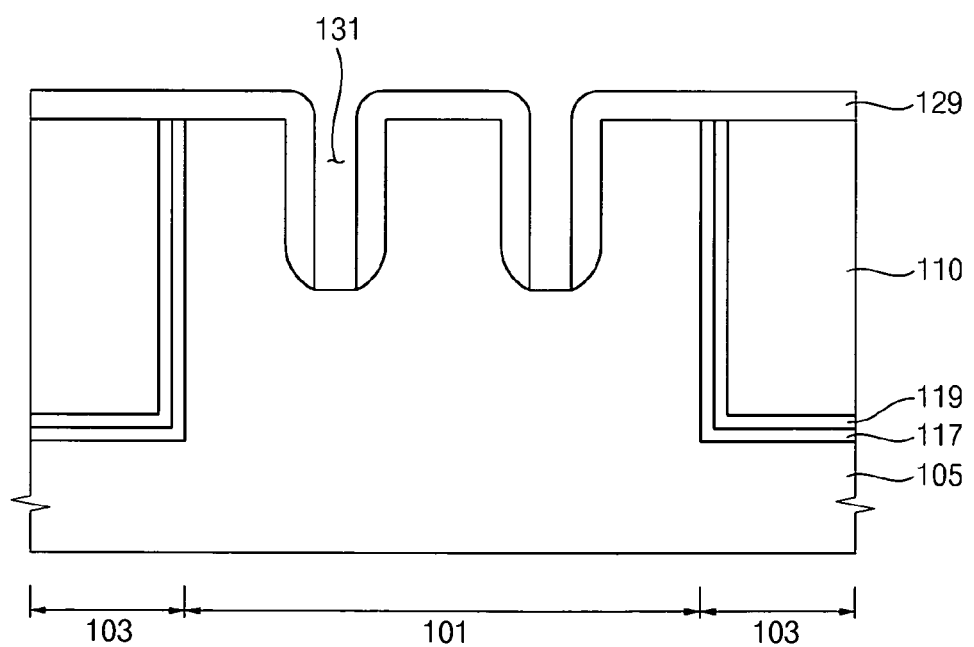
Figure 11C:
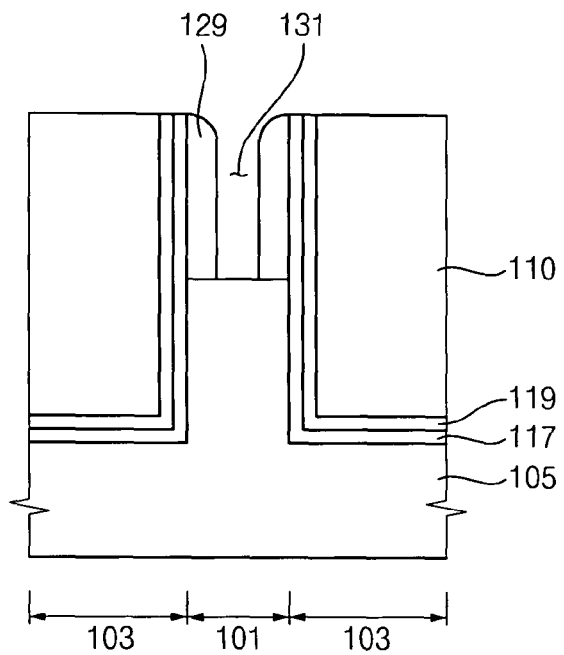

Referring to FIGS. 11A to 11C, after removing the hard mask pattern 124 and the pad insulation layer pattern 121, a spacer layer (not shown) may be formed on the upper surface (or the entire upper surface) of the substrate 105. The spacer layer may be formed along a profile of the upper recess 131. The spacer layer may include a material having an etching selectivity with respect to the substrate 105. The spacer layer may include a thermal oxide.

The spacer layer may be anisotropically etched to form a spacer 129 on a side surface of the upper recess 131 and the upper surface of the substrate 105.

Figure 12A:
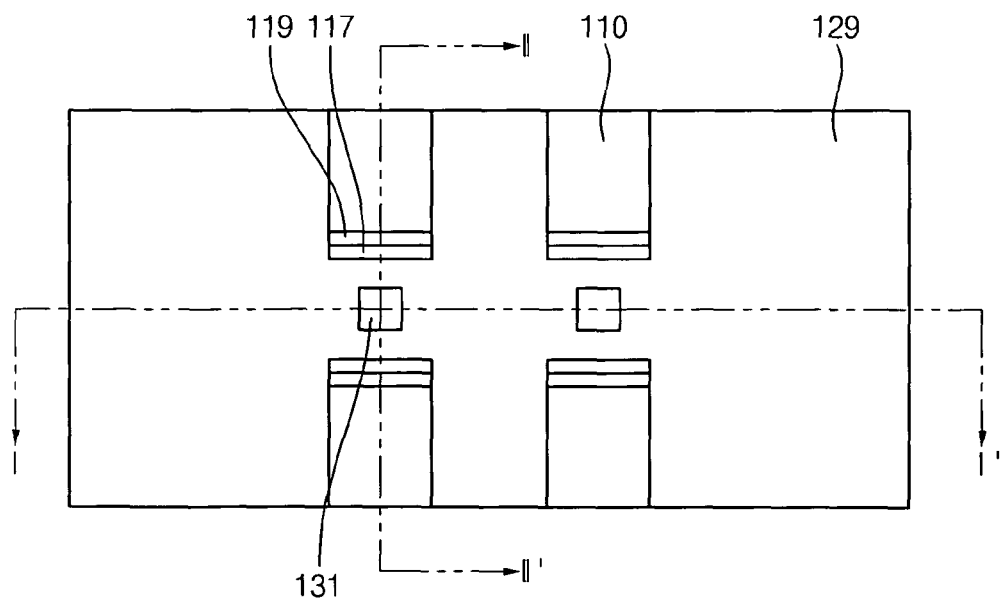
Figure 12B:
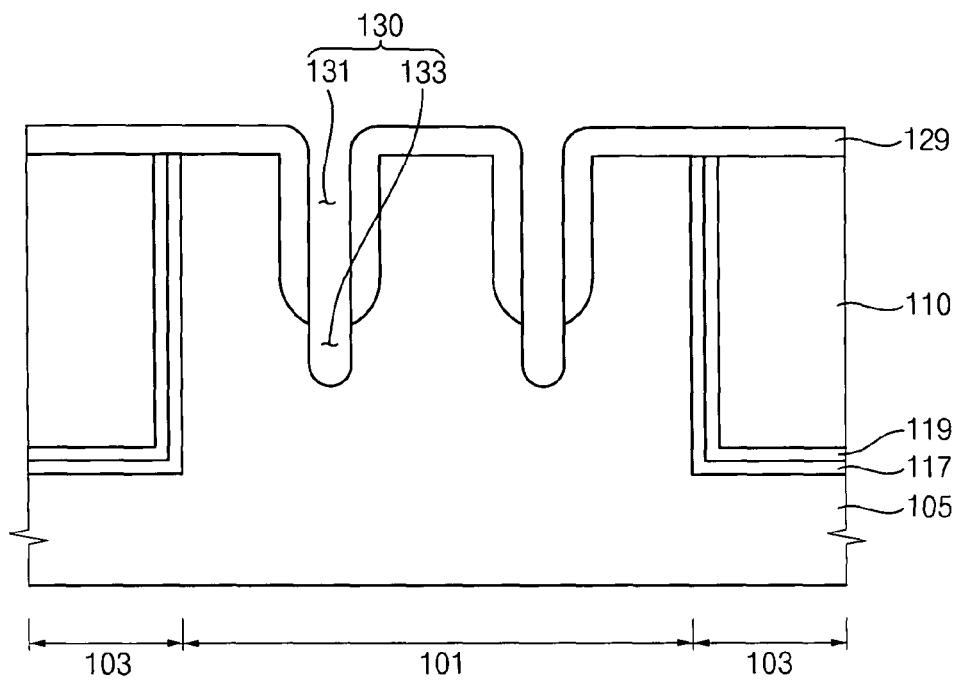
Figure 12C:
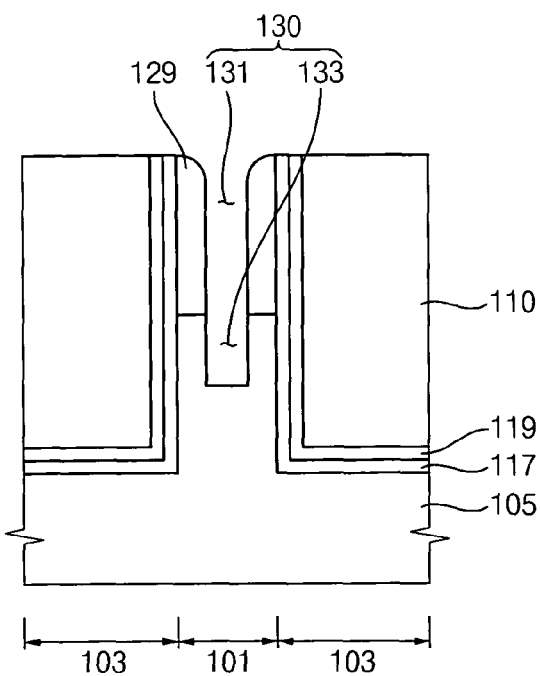

Referring to FIGS. 12A to 12C, the substrate 105 exposed through the upper recess 131 may be partially etched using the spacer 129 as an etching mask to form a lower recess 133 connected to (or in communication with) the upper recess 131. The lower recess 133 may have a second width less than the first width of the upper recess 131.

Figure 13A:
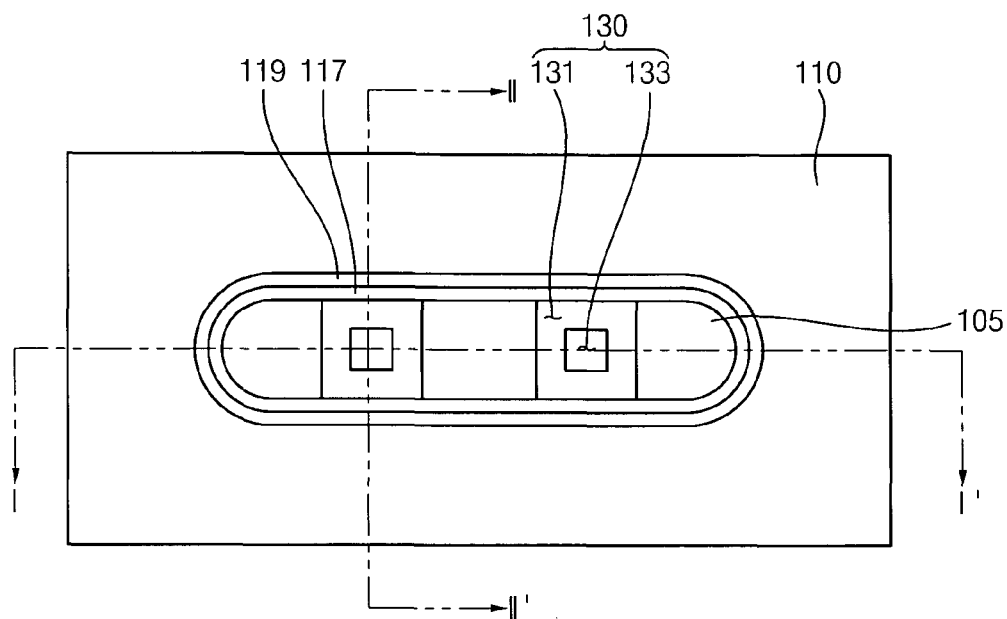
Figure 13B:
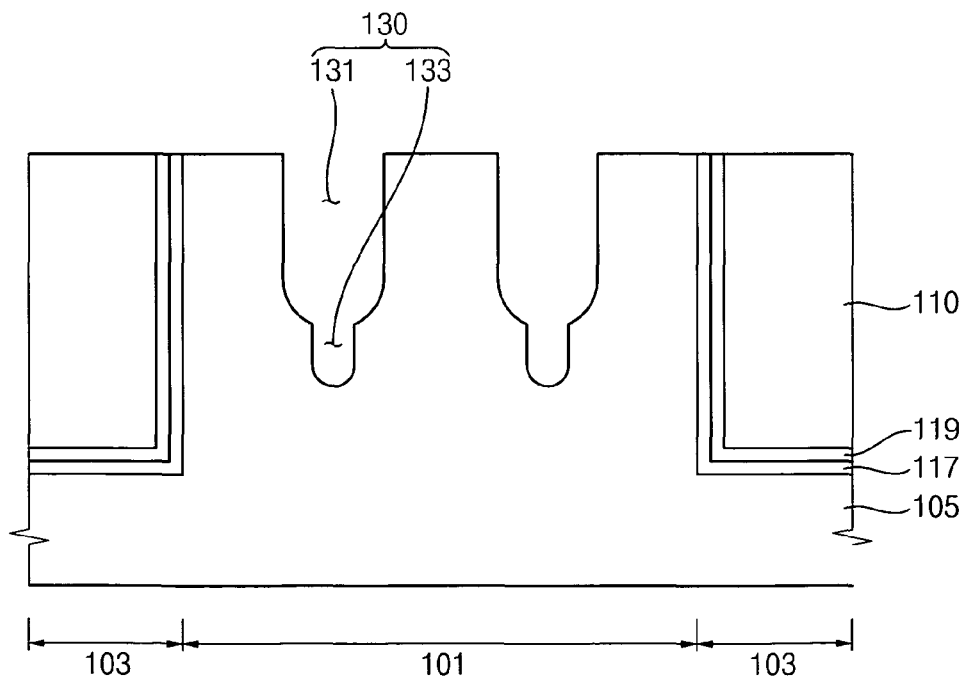
Figure 13C:
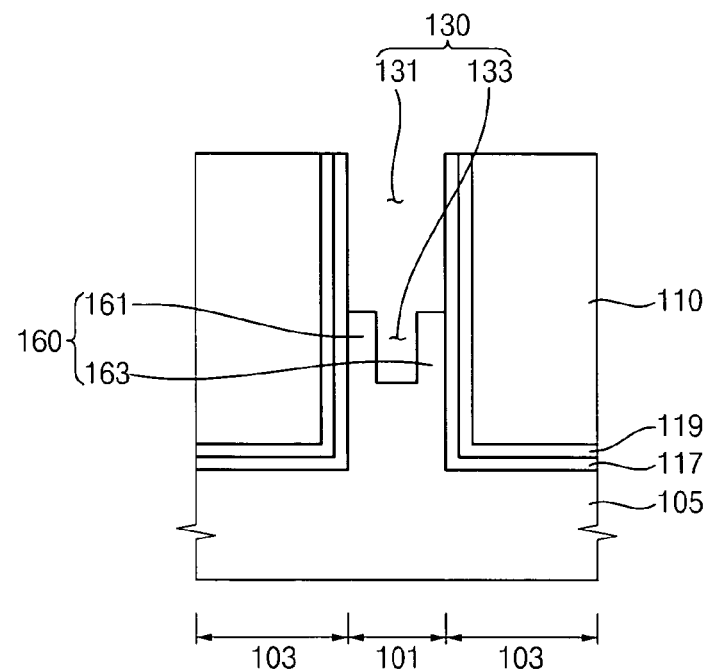

Referring to FIGS. 13A to 13C, the spacer 129 may be removed from the substrate 105. The spacer 129 may be removed by a stripping process. As such, a recessed structure 130 including the upper recess 131 and the lower recess 133 may formed. An active pin 160 may be formed between the side surfaces of the lower recess 133 and the isolation layer 110.

The active pin 160 may be formed (or configured to) surround the side surface of the lower recess 133. The active pin 160 may include a plurality of pins (not shown) arranged at an interface between the side surfaces of the lower recess 133 and the isolation layer 110. The active pin 160 may include a first active pin portion 161 and a second active pin portion 162.

Figure 14A:
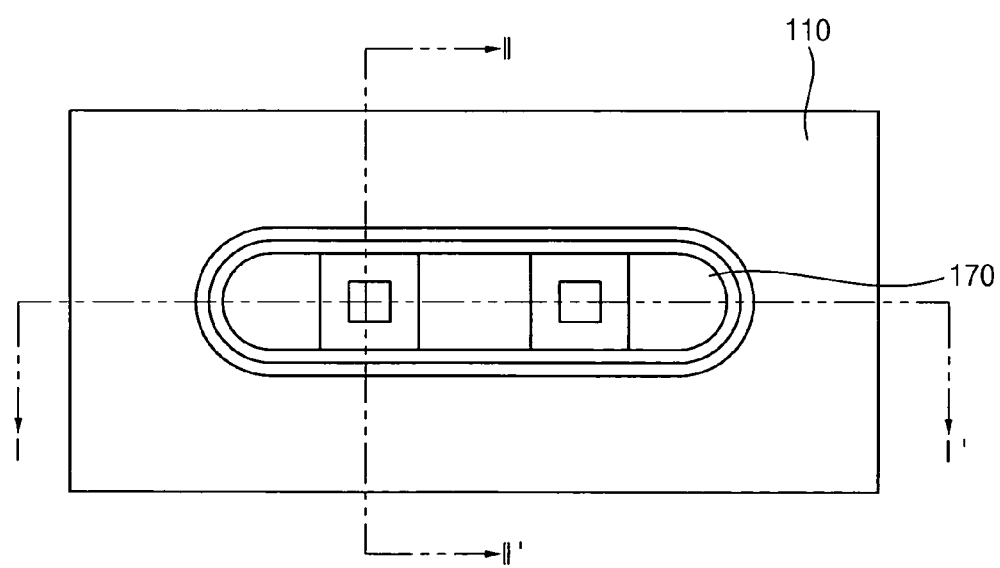
Figure 14B:
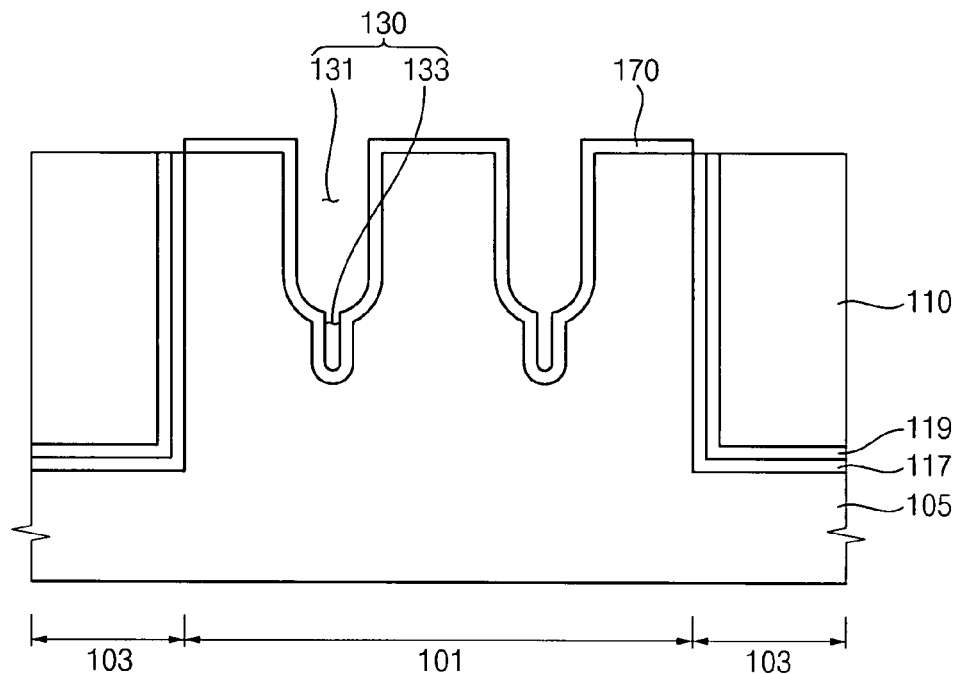
Figure 14C:
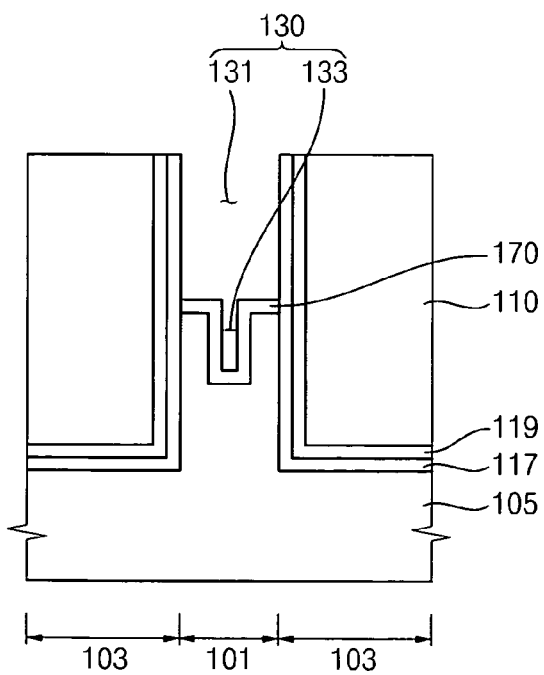

Referring to FIGS. 14A to 14C, a gate insulation layer 170 may be formed on the upper surfaces of the recessed structure 130 and the active region 101 of the substrate 105. The gate insulation layer 170 extends from the upper surfaces of the upper recess 131 and the lower recess 133 to the upper surface of the substrate 105. The gate insulation layer 170 may be formed by a thermal oxidation process, a CVD process, a PECVD process, an ALD process or a similar process.

The gate insulation layer 170 may include oxide or metal oxide having a substantially high dielectric constant. The gate insulation layer 170 may include silicon oxide ($SiO_2$), hafnium oxide ($HfO_2$), tantalum oxide ($Ta_2O_5$), zirconium oxide ($ZrO_2$), titanium oxide ($TiO_2$), aluminum oxide ($Al_2O_3$) or similar compound. The gate insulation layer 170 may have a first thickness measured from the upper surface of the recessed structure 130. The first thickness of the gate insulation layer 170 may be about 50 Å to about 100 Å from the upper surface of the recessed structure 130.

Figure 15A:
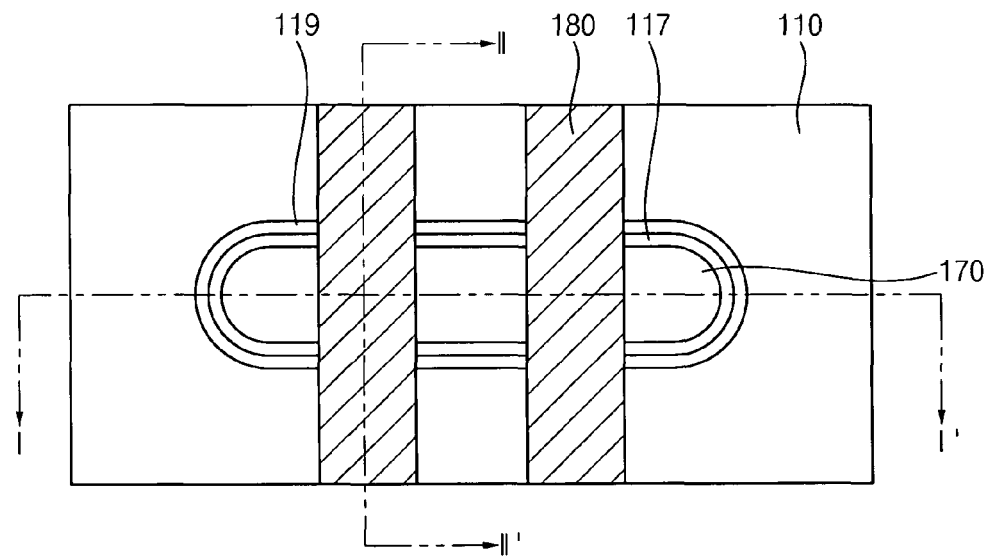
Figure 15B:
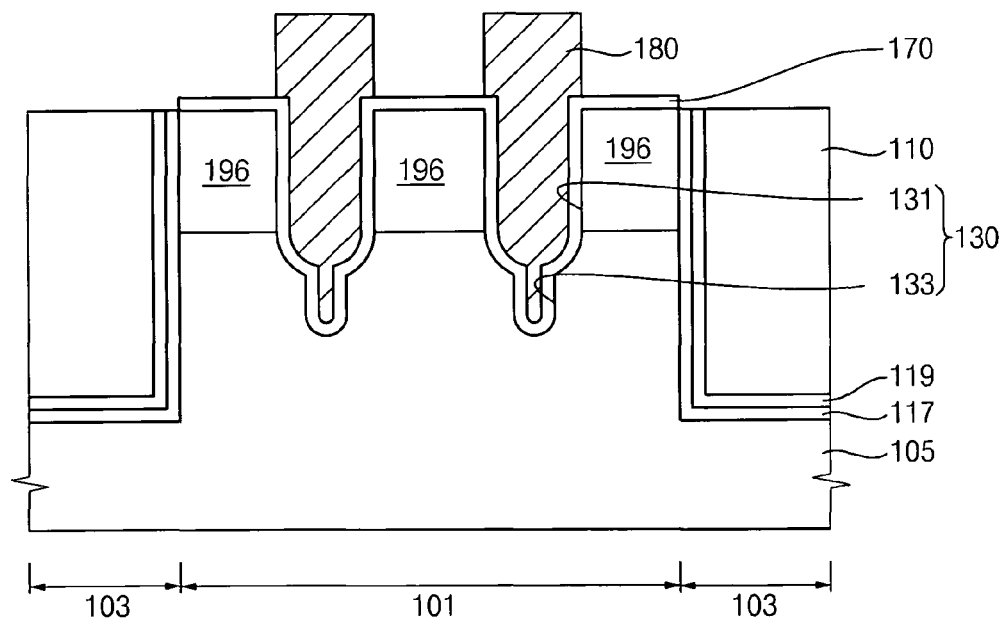
Figure 15C:
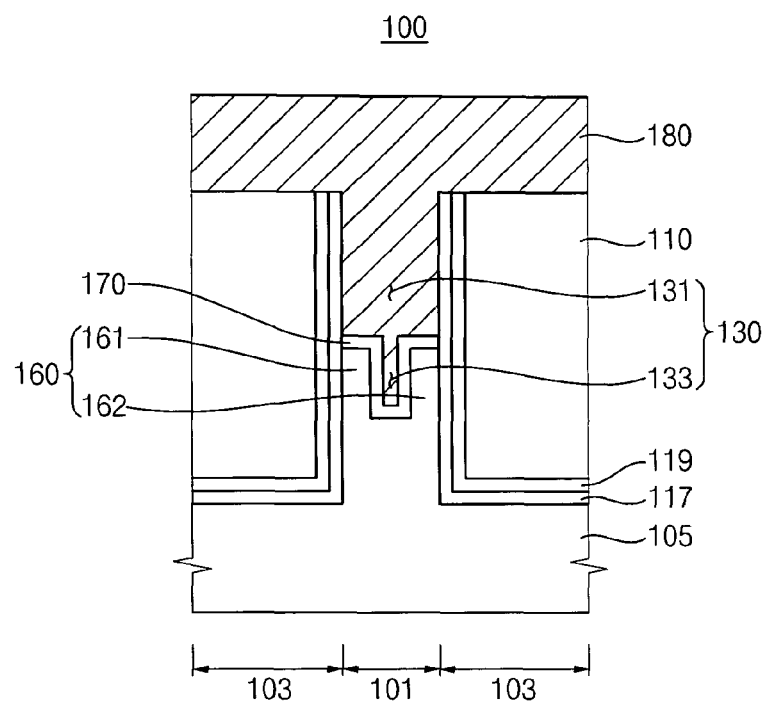

Referring to FIGS. 15A to 15C, a conductive layer (not shown) may be formed on the substrate 105 in the recessed structure 130 including the upper recess 131 and the lower recess 133. The conductive layer may include polysilicon doped with impurities, metal or the like. The conductive layer may be formed by performing a CVD process, an ALD process, a sputtering process, a PLD process, an electron beam deposition process or similar process.

The conductive layer may have a polycide structure including a polysilicon layer doped with impurities and a metal silicide layer.

A gate mask layer (not shown) may be formed on the conductive layer. The gate mask layer may include a material having an etching selectivity with respect to the conductive layer. The gate mask layer may include nitride (e.g., silicon nitride, oxynitride (silicon oxynitride or titanium oxynitride), oxide (silicon oxide) or similar compounds). The gate mask layer may be formed by a CVD process, a PECVD process, an ALD process, a HDP-CVD process or similar process.

A third photoresist pattern (not shown) may be formed on the gate mask layer. The gate mask layer may be etched using the third photoresist pattern as an etching mask to form a gate mask (not shown) on the conductive layer.

The third photoresist pattern may be removed by performing an ashing process and/or a stripping process. The conductive layer may be patterned using the gate mask. The conductive may be partially etched using the gate mask as an etching mask to form a conductive layer pattern in the trench structure 130, forming a gate electrode 180 including the conductive layer pattern and the gate mask. As such, a gate pattern 185 including the gate insulation layer 170 and the gate electrode 180 may be formed.

Impurities may be implanted into the active region 101 adjacent to the gate electrode 180 using the gate pattern 185 as an ion implantation mask to form source/drain regions 196 adjacent to the gate electrode 180. As such, a recessed transistor including the gate pattern 185 and the source/drain regions 196 may be formed in the active region 101.

FIGS. 16A, 17A, 18A, 19A, 20A, 21A and 22A are diagrams illustrating plan views of a method of manufacturing a recessed transistor in accordance with example embodiments. FIGS. 16B, 17B, 18B, 19B, 20B, 21B and 22B are diagrams illustrating cross-sectional views taken along lines I-I' in FIGS. 16A, 17A, 18A, 19A, 20A, 21A and 22A, respectively. FIGS. 16C, 17C, 18C, 19C, 20C, 21C and 22C are diagrams illustrating cross-sectional views taken along lines II-II' in FIGS. 16A, 17A, 18A, 19A, 20A, 21A and 22A, respectively.

Figure 16A:
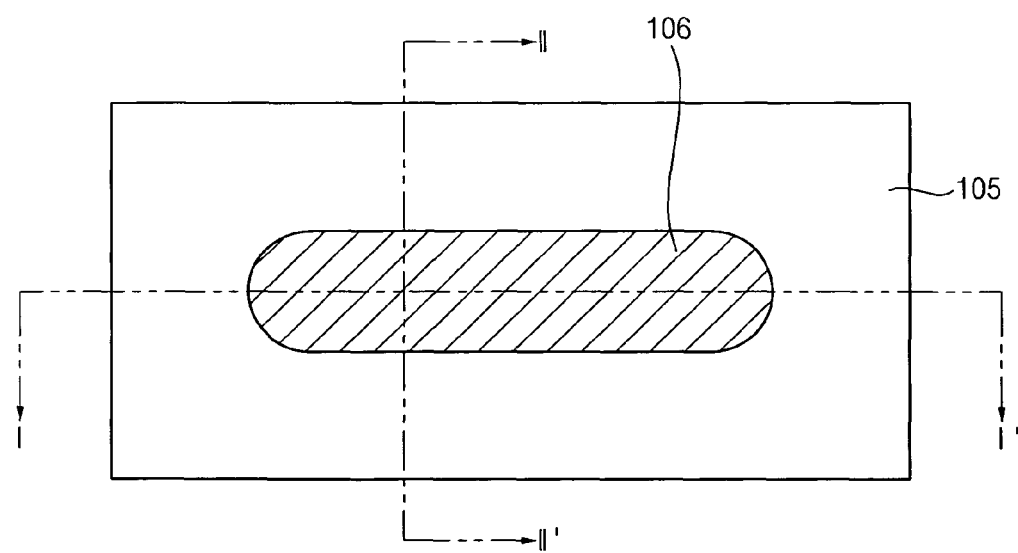
FIGS. 16A, 17A, 18A, 19A, 20A, 21A and 22A are diagrams illustrating plan views of a method of manufacturing a recessed transistor according to example embodiments.
Figure 16B:
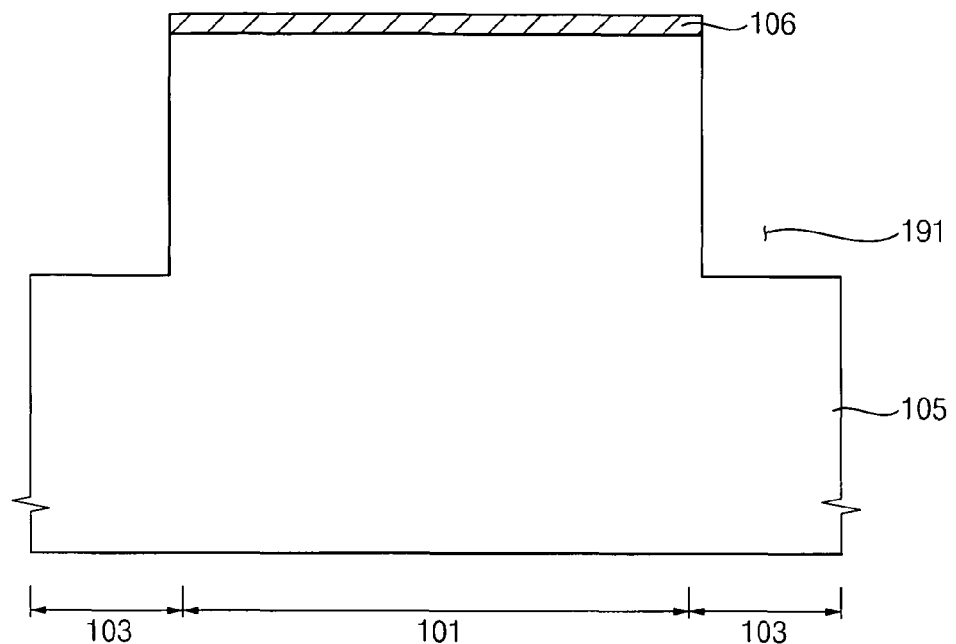
FIGS. 16B, 17B, 18B, 19B, 20B, 21B and 22B are diagrams illustrating cross-sectional views taken along lines I-I' in FIGS. 16A, 17A, 18A, 19A, 20A, 21A and 22A, respectively.
Figure 16C:
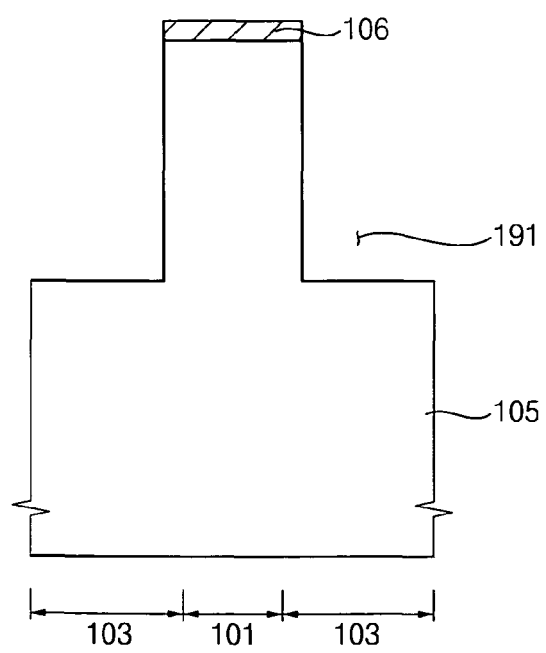

Referring to FIGS. 16A to 16C, a hard mask layer (not shown) may be formed on a substrate 105. The hard mask layer may include a material having an etching selectivity with respect to the substrate 105. The hard mask layer may include silicon nitride, silicon oxynitride or similar compounds.

A first photoresist pattern (not shown) may be formed on the hard mask layer. The hard mask may be patterned using the first photoresist pattern to form a hard mask pattern 106 on the substrate 105. A region of the substrate 105 where the hard mask pattern 106 is formed may be established as an active region 101. A region of the substrate 105 surrounded by the active region 101 may be established as a field region 103.

The first photoresist pattern may be removed by an ashing process and/or the stripping process. The field region 103 of the substrate 105 exposed through the hard mask pattern 106 may be primarily etched using the hard mask pattern 106 as an etching mask to form an upper trench 191. The upper trench 191 may have a first width. The primary etching process may include an anisotropic etching process. The primary etching process may include a dry anisotropic etching process, a chemical anisotropic etching process or a similar process.

Figure 17A:
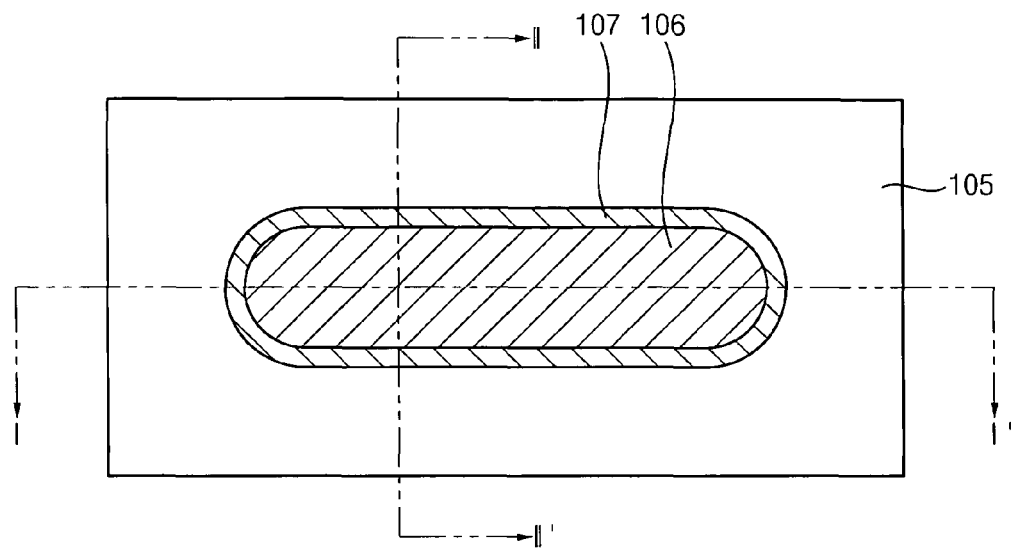
Figure 17B:
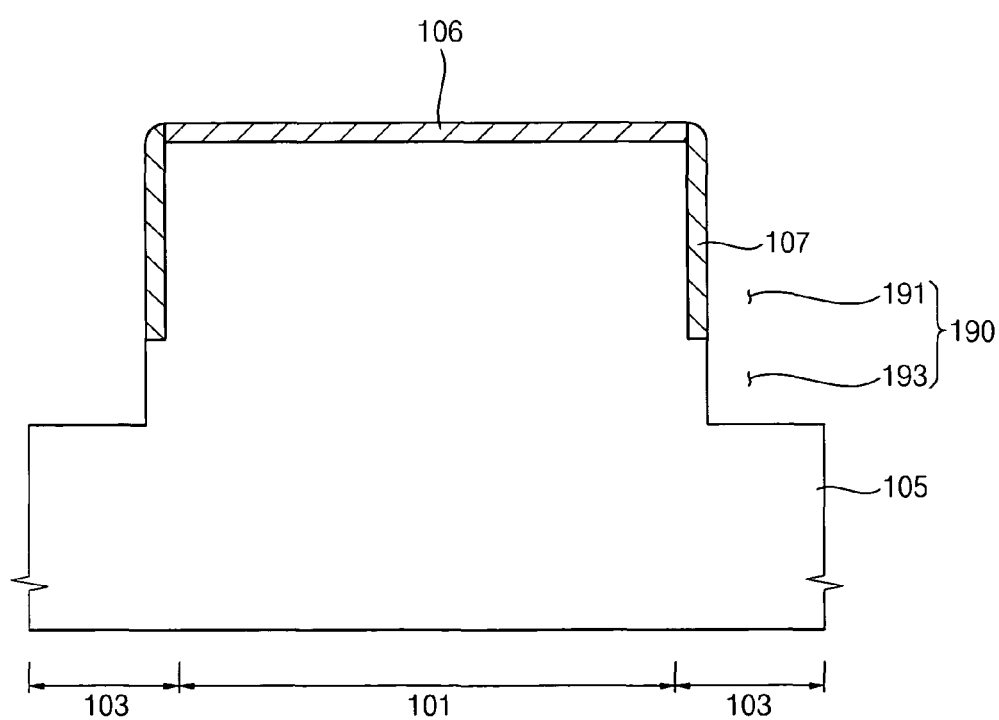
Figure 17C:
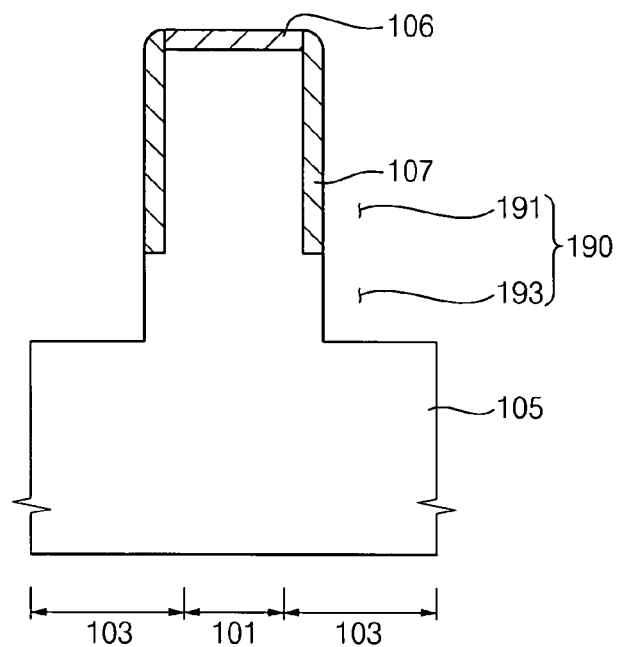

Referring to FIGS. 17A to 17C, a first spacer layer (not shown) may be formed on the substrate 105 having the hard mask pattern 106. The first spacer layer may be anisotropically etched to form a first spacer 107 on a side surface of the upper trench 191.

The substrate 105 adjacent to a bottom surface of the upper trench 191 may be secondarily etched using the hard mask pattern 106 and the first spacer 107 as an etching mask to form a lower trench 193 connected to (or in communication with) the upper trench 191. The lower trench 193 may have a second width greater than the first width of the upper trench 191. As such, a trench structure 190 including the upper trench 191 and the lower trench 193 may be formed at a surface portion of the substrate 105.

The lower trench 193 may have a side surface inclined with respect to the substrate 105.

Figure 18A:
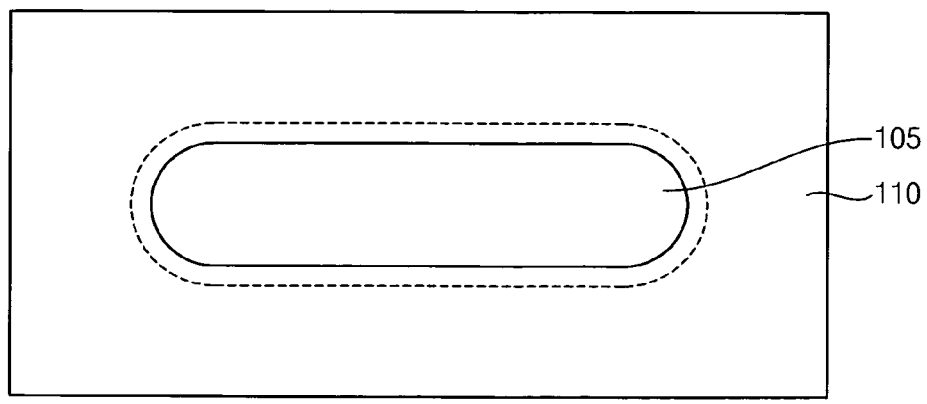
Figure 18B:
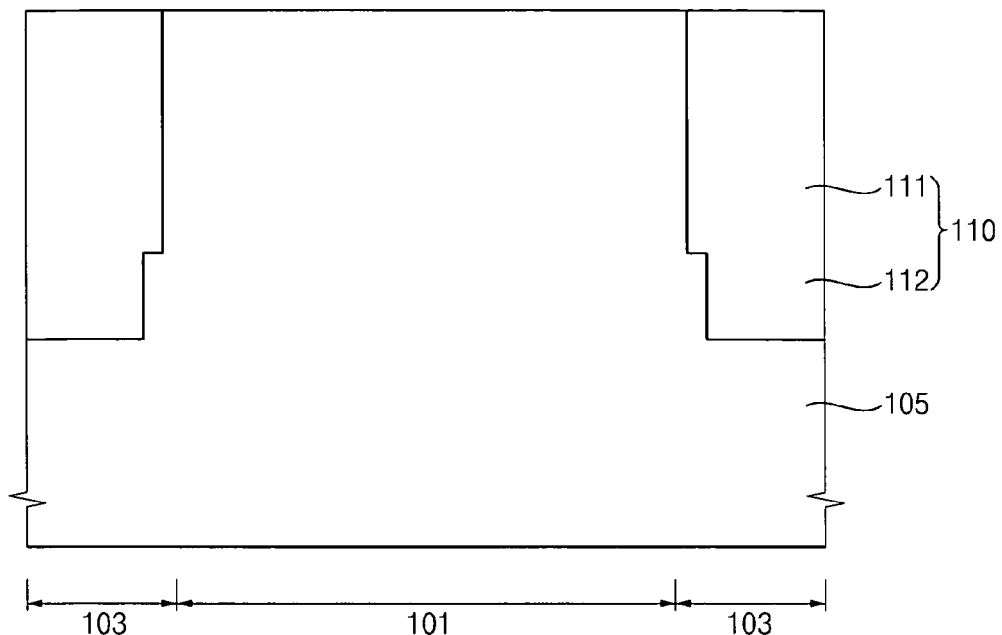
Figure 18C:
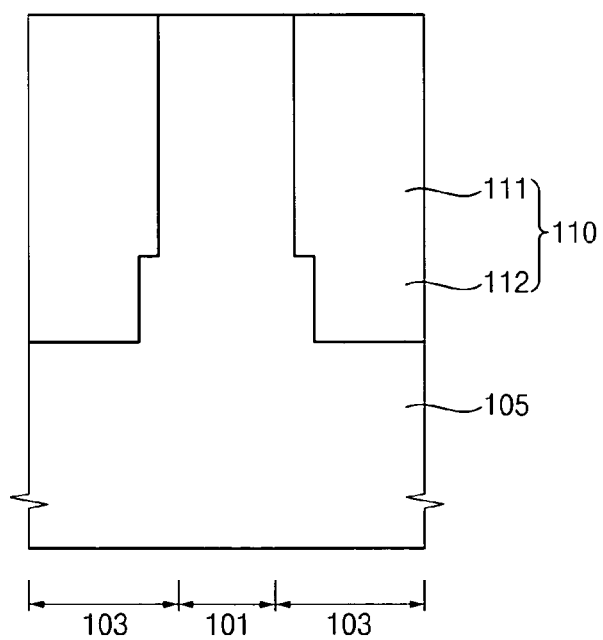

Referring to FIGS. 18A to 18C, a curing layer (not shown) and a liner layer (not shown) may be sequentially formed on the side surface and the bottom surface of the trench structure 190. The curing layer may repair (or cure) damages to the substrate 105 caused by collisions of ions having substantially high energy. The liner layer may prevent (or suppress) impurities (e.g., carbon or hydrogen) in an isolation layer from diffusing into the active region 101.

A field isolation layer (not shown) may be formed on the substrate 105 and in the trench structure 190. The field isolation layer may include undoped silicate glass (USG), tetraethyl orthosilicate (TEOS), high density plasma (HDP) oxide or similar compounds. When the field isolation layer includes the HDP oxide, the field insulation layer may be formed using a plasma source including a silane gas, an oxygen gas and/or an argon gas.

The field insulation layer may be planarized until an upper surface of the curing layer in the active region is exposed to form the isolation layer 110 in the trench structure 190. The field insulation layer may be planarized by a chemical mechanical polishing (CMP) process and/or an etch-back process. As such, the isolation 110 including a first insulation layer pattern 111 in the upper trench 191 and a second insulation layer pattern 112 in the lower trench 193 may be formed. The first insulation layer pattern 111 may have a width greater than that of the second insulation layer pattern 112.

Figure 19A:
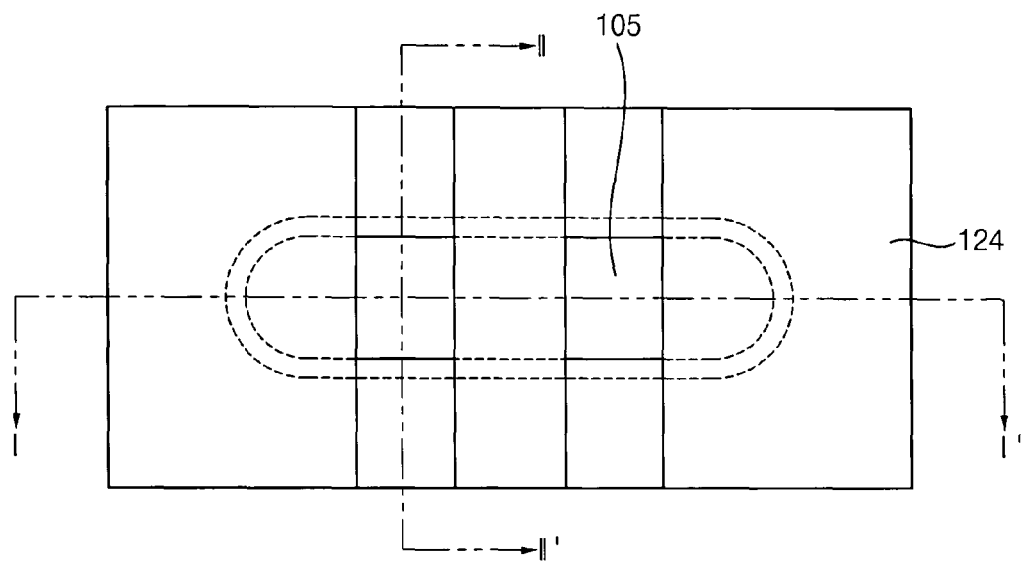
Figure 19B:
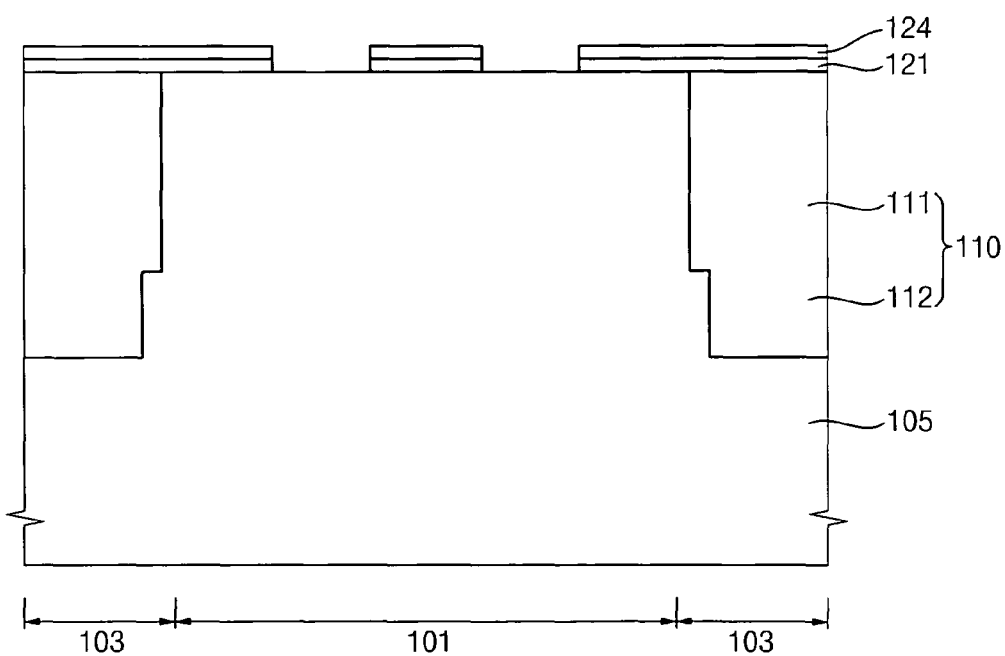
Figure 19C:
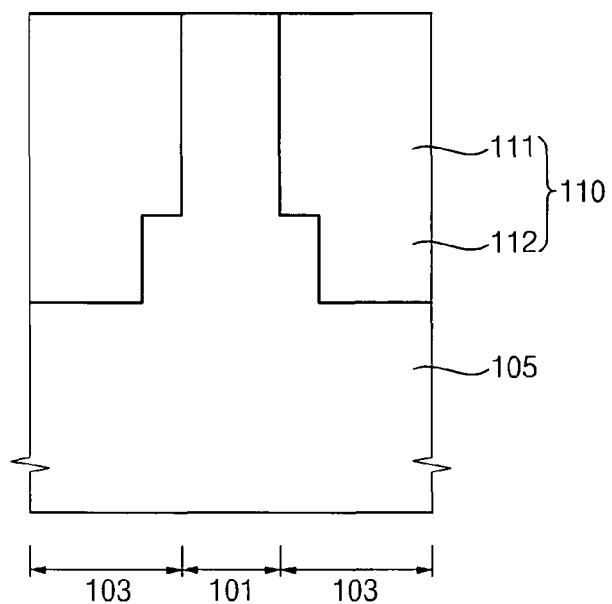

Referring to FIGS. 19A to 19C, a pad insulation layer and a hard mask layer may be sequentially formed on the substrate 105.

The pad insulation layer may be formed by a thermal oxidation process, a chemical vapor deposition (CVD) process, a HDP-CVD process or a similar process.

The hard mask layer may include a material having an etching selectivity with respect to the substrate 105 and the pad insulation layer. The hard mask layer may include nitride (e.g., silicon nitride, oxynitride (silicon oxynitride and titanium oxynitride) or a similar compound). The hard mask layer may be a CVD process, a plasma-enhanced chemical vapor deposition (PECVD) process, an atomic layer deposition (ALD) process, a sputtering process, a pulse laser deposition (PLD) process or a similar process.

A second photoresist pattern (not shown) may be formed on the hard mask layer. The second photoresist pattern partially exposes the hard mask layer.

The hard mask layer may be partially etched using the second photoresist pattern as an etching mask to form a hard mask pattern 124 on the pad insulation layer. The second photoresist pattern may be removed by an ashing process and/or a stripping process.

The pad insulation layer may be partially etched using the hard mask pattern 124 as an etching mask to form a pad insulation layer pattern 121 on the substrate 105.

Figure 20A:
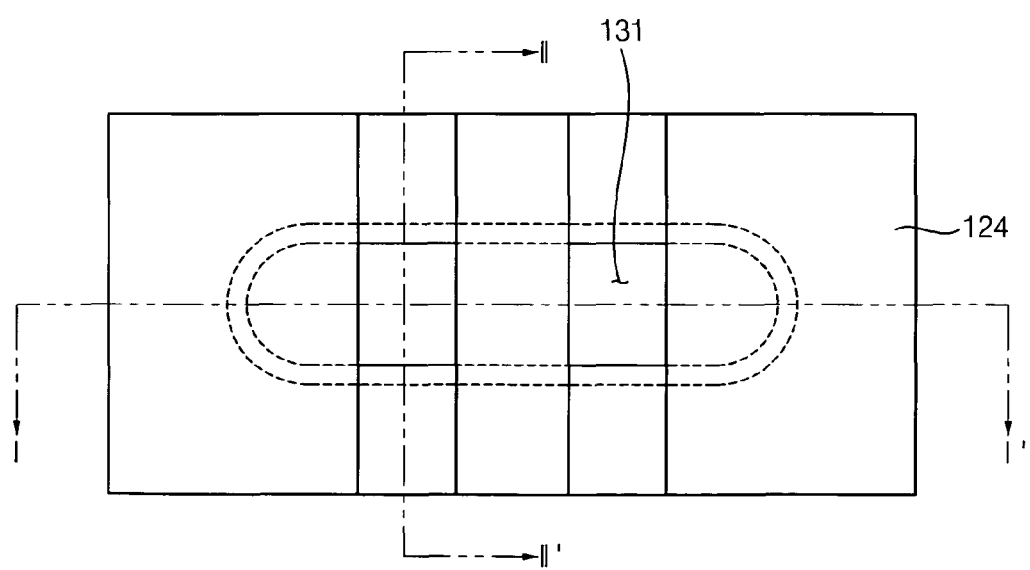
Figure 20B:
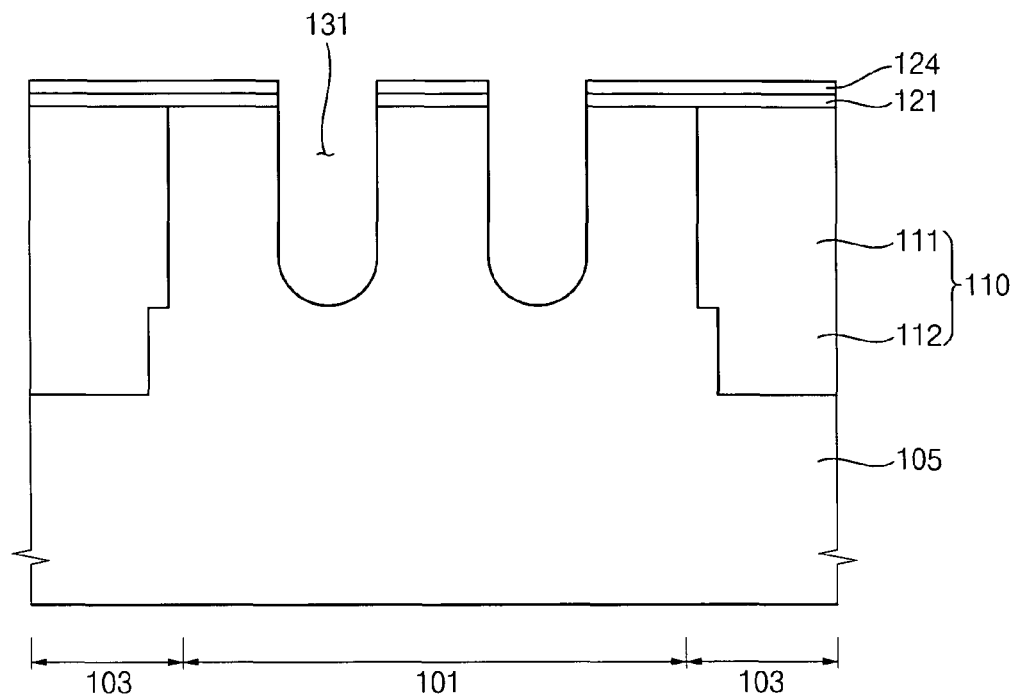
Figure 20C:
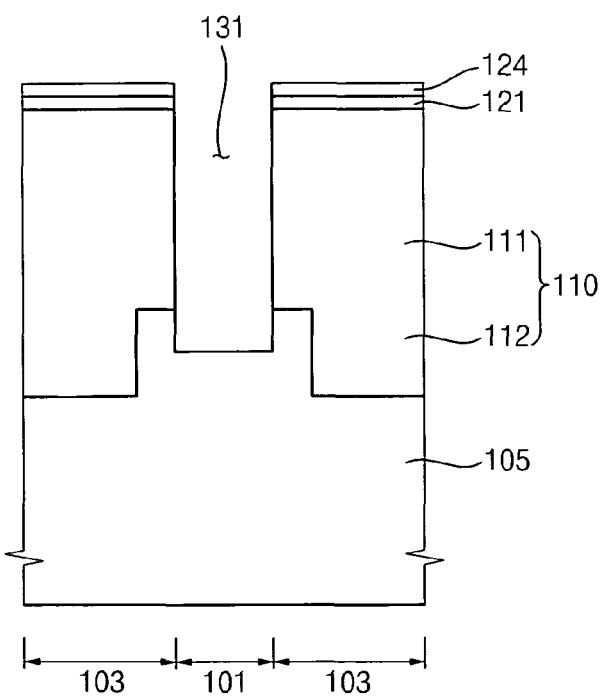

Referring to FIGS. 20A to 20C, a tertiary etching process may be performed on the substrate 105 using the hard mask pattern 124 and the pad insulation layer pattern 121 as an etching mask to form an upper recess 131 at a surface portion of the substrate 105. The tertiary etching process may include an anisotropic etching process. The upper recess 131 has a first width. The first width of the upper recess 131 may be about 500 Å to about 700 Å. The upper recess 131 may have a side surface substantially perpendicular to the upper surface of the substrate 105.

Figure 21A:
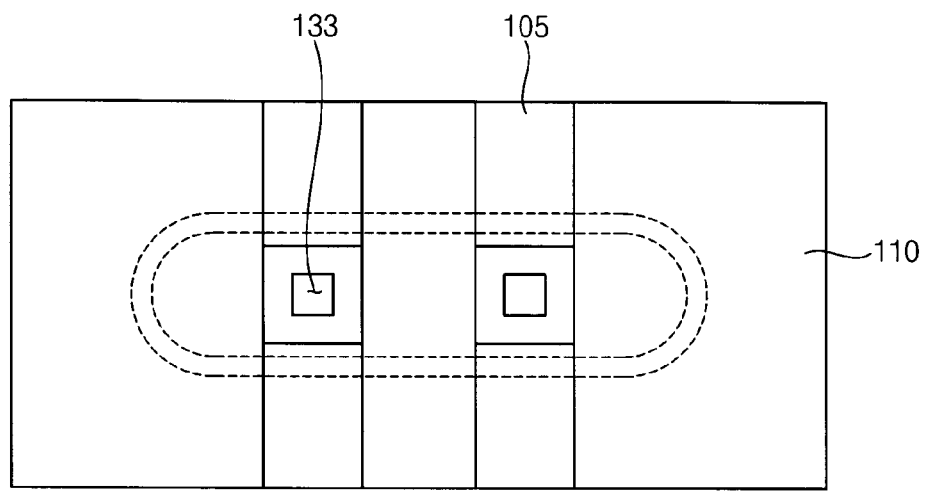
Figure 21B:
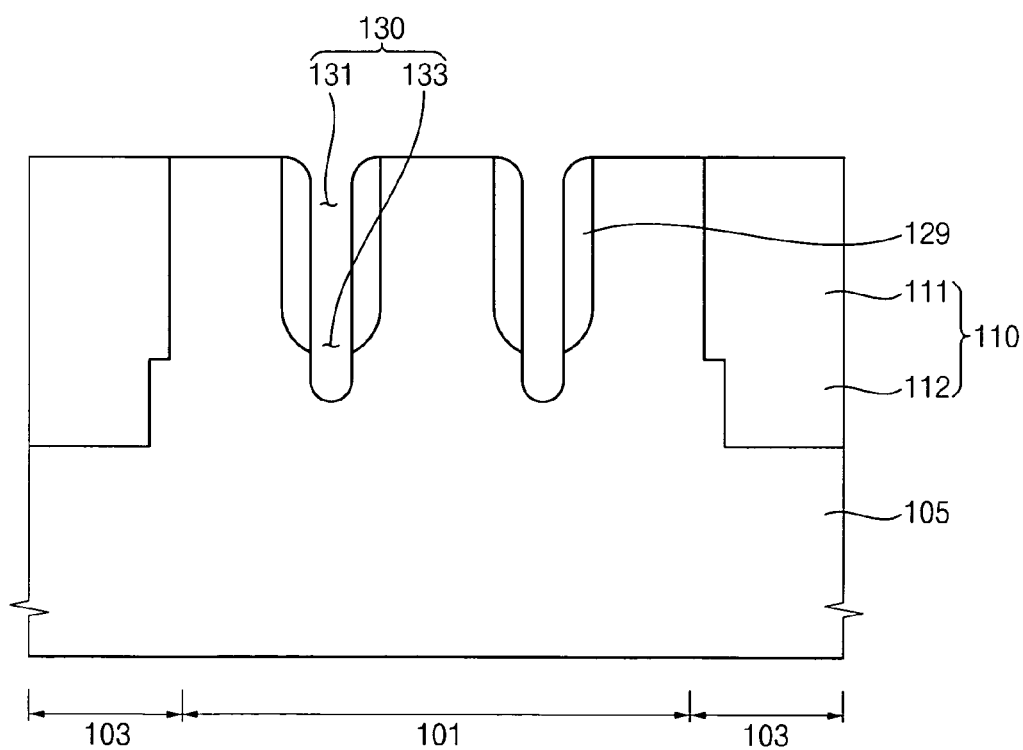
Figure 21C:
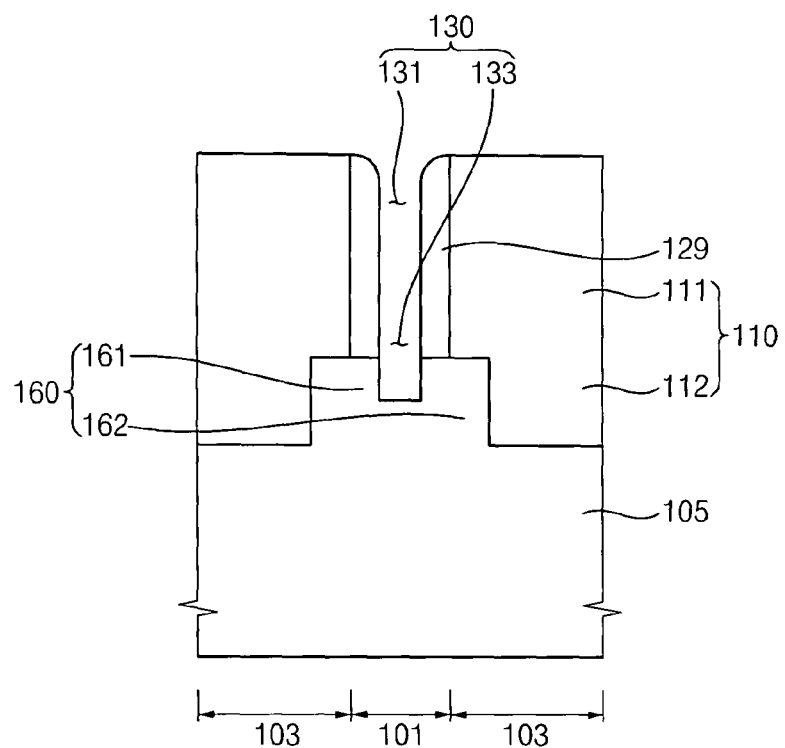

Referring to FIGS. 21A to 21C, after removing the hard mask pattern 124 and the pad insulation layer pattern 121, a spacer layer (not shown) may be formed on the upper surface (or the entire upper surface) of the substrate 105. The spacer layer may be formed along a profile of the upper recess 131. The spacer layer may include a material having an etching selectivity with respect to the substrate 105. The spacer layer may include a thermal oxide. The spacer layer may be anisotropically etched to form a second spacer 129 on a side surface of the upper recess 131.

The substrate 105 exposed through the upper recess 131 may be partially etched using the second spacer 129 as an etching mask to form a lower recess 133 in communication with (or connected to) the upper recess 131. The lower recess 133 may have a second width less than the first width of the upper recess 131. The second spacer 129 may be removed from the substrate 105. The second spacer 129 may be removed by a stripping process. As such, a recessed structure 130 including the upper recess 131 and the lower recess 133 may be formed. An active pin 160 may be formed between the side surfaces of the lower recess 133 and the isolation layer 110.

The active pin 160 may surround the side surface of the lower recess 133. The active pin 160 may include a plurality of pins (not shown) arranged at an interface between the side surfaces of the lower recess 133 and the isolation layer 110. The active pin 160 may include a first active pin portion 161 and a second active pin portion 162.

The process for forming the lower recess 133 using the second spacer 129 may be omitted. The upper recess 131 and the lower recess 133 may be formed by performing the tertiary etching process using the hard mask pattern 124 and the pad insulation layer pattern 121 as etching masks. The upper recess 131 and the lower recess 133 may have substantially the same width. When the upper recess 131 and the lower recess 133 of the recessed structure 130 have substantially the same width, the active pin 160 may be formed between the side surfaces of the lower recess 133 and the isolation layer 110. The active pin 160 may include a plurality of pins (not shown) arranged at an interface between the side surfaces of the lower recess 133 and the isolation layer 110. The active pin 160 may include a first active pin portion 161 and a second active pin portion 162.

Figure 22A:
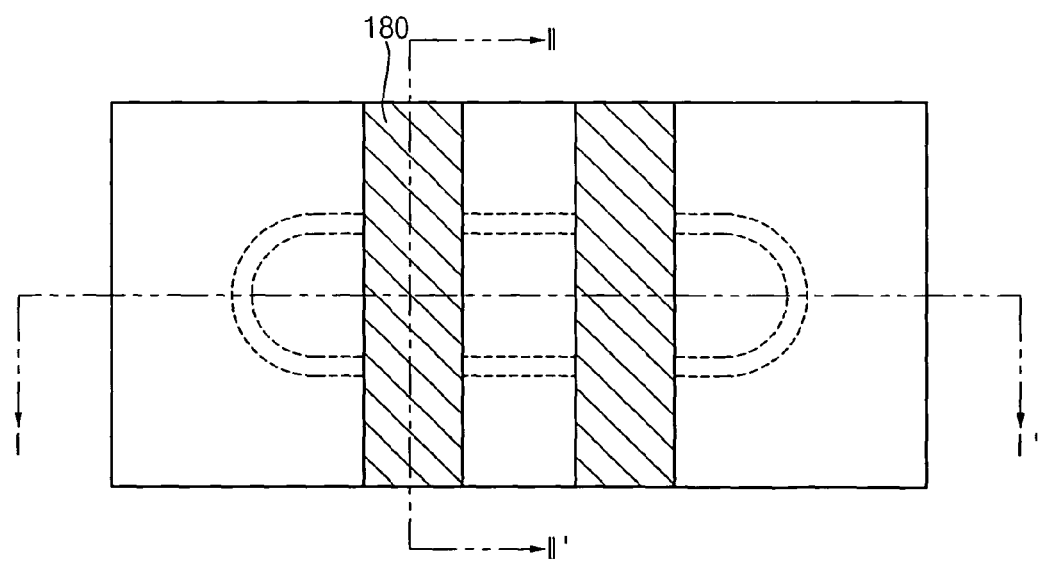
Figure 22B:
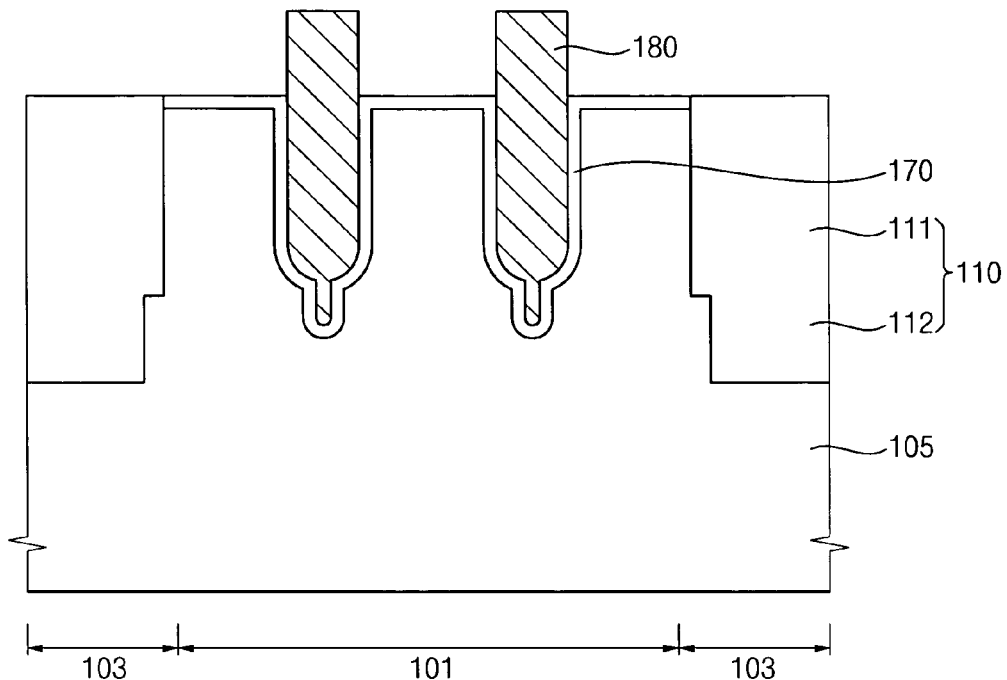
Figure 22C:
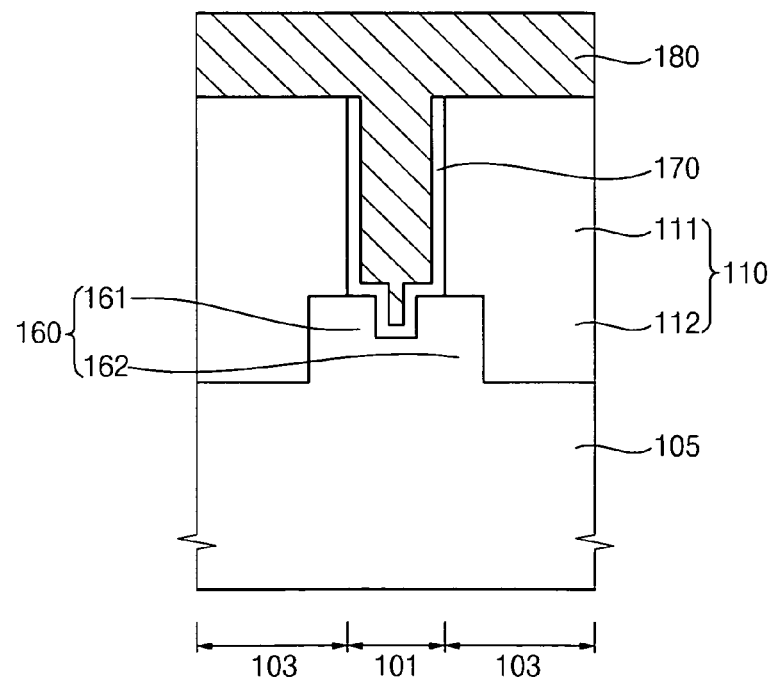

Referring to FIGS. 22A to 22C, a gate insulation layer 170 may be formed on the upper surfaces of the recessed structure 130 and the active region 101 of the substrate 105. The gate insulation layer 170 extends from the upper surfaces of the upper recess 131 and the lower recess 133 to the upper surface of the substrate 105. The gate insulation layer 170 may be formed by a thermal oxidation process, a CVD process, a PECVD process, an ALD process or a similar process.

The gate insulation layer 170 may include oxide or metal oxide having a substantially high dielectric constant. The gate insulation layer 170 may include silicon oxide ($SiO_2$), hafnium oxide ($HfO_2$), tantalum oxide ($Ta_2O_5$), zirconium oxide ($ZrO_2$), titanium oxide ($TiO_2$), aluminum oxide ($Al_2O_3$) or the like. The gate insulation layer 170 may have a first thickness measured from the upper surface of the recessed structure 130. The first thickness of the gate insulation layer 170 may be about 50 Å to about 100 Å from the upper surface of the recessed structure 130.

A conductive layer (not shown) may be formed on the substrate 105 in the recessed structure 130 including the upper recess 131 and the lower recess 133. The conductive layer may include polysilicon doped with impurities, metal or the like. The conductive layer may be formed by a CVD process, an ALD process, a sputtering process, a PLD process, an electron beam deposition process or a similar process.

The conductive layer may have a polycide structure including a polysilicon layer doped with impurities and a metal silicide layer.

A gate mask layer (not shown) may be formed on the conductive layer. The gate mask layer may include a material having an etching selectivity with respect to the conductive layer. The gate mask layer may include nitride (e.g., silicon nitride, oxynitride (silicon oxynitride, titanium oxynitride or the like), oxide (silicon oxide or the like) or similar compounds). The gate mask layer may be formed by a CVD process, a PECVD process, an ALD process, a HDP-CVD process or a similar process.

A third photoresist pattern (not shown) may be formed on the gate mask layer. The gate mask layer may be etched using the third photoresist pattern as an etching mask to form a gate mask (not shown) on the conductive layer.

The third photoresist pattern may be removed by an ashing process and/or a stripping process. The conductive layer may be patterned using the gate mask. The conductive may be partially etched using the gate mask as an etching mask to form a conductive layer pattern in the trench structure 130, forming a gate electrode 180 including the conductive layer pattern and the gate mask. As such, a gate pattern 185 including the gate insulation layer 170 and the gate electrode 180 may be formed.

Impurities may be implanted into the active region 101 adjacent to the gate electrode 180 using the gate pattern 185 as an ion implantation mask to form source/drain regions 196 adjacent to the gate electrode 180. As such, a recessed transistor including the gate pattern 185 and the source/drain regions 196 may be formed in the active region 101.

According to example embodiments, the active pin may be formed between the side surfaces of the lower recess and the isolation layer to produce desirable affects with regard to a swing phenomenon, which may be caused by fluctuations in an effective charge density per unit channel length in accordance with a profile of a bottom surface in the lower recess. A channel may be formed along the gate insulation layer on the upper surface of the active pin and the side surface of the upper recess so that changes in electrical characteristics of the recessed transistor caused by the profile of the lower recess may decrease. As such, the recessed transistor may have increased electrical characteristics.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A recessed transistor, comprising:
   an isolation layer that establishes an active region and a field region of a substrate;
   a recessed structure having an upper recess on a surface portion of the active region and a lower recess in communication with the upper recess;
   an active pin in the active region and interposed between side surfaces of the isolation layer and the lower recess and between interfaces of the active region and the field region, wherein the active pin encloses the lower recess of the recessed structure in a cross sectional direction along a width of the recessed transistor;
   a gate insulation layer on a side surface and a bottom surface of the recessed structure;
   a gate electrode on the gate insulation layer in the recessed structure and on the isolation layer, the gate electrode having a linear shape extending on the gate insulation layer and the isolation layer in the cross sectional direction along the width of the recessed transistor; and
   source and drain regions in the active region adjacent to the gate electrode,
   wherein the active pin includes a first active pin portion and a second active pin portion in the cross sectional direction, the first and second active pin portions having top surfaces lower than a top surface of the isolation layer,
   the first active pin portion, the lower recess and the second active pin portion are interposed between side surfaces of the isolation layer in the cross sectional direction along the width of the recessed transistor, and
   a width of the lower recess in the cross sectional direction is less than a width of the upper recess in the cross sectional direction.

2. The recessed transistor of claim 1, wherein the upper recess has a first width ($w_1$) and the lower recess has a second width ($w_2$) less than the first width ($w_1$).

3. The recessed transistor of claim 1, wherein the upper recess has a side surface substantially perpendicular to an upper surface of the substrate.

4. The recessed transistor of claim 1, wherein the isolation layer has an inclined side surface having a cross-sectional area that gradually enlarges toward an upper surface of the substrate.

5. The recessed transistor of claim 1, wherein the isolation layer includes a first insulation layer pattern; and a second insulation layer pattern arranged under the first insulation layer pattern.

6. The recessed transistor of claim 5, wherein the second insulation layer pattern has an inclined side surface having a cross-sectional area that gradually enlarges toward an upper surface of the substrate.

7. The recessed transistor of claim 5, wherein a width of the first insulation layer pattern is greater than that of the second insulation layer pattern.

8. The recessed transistor of claim 7, wherein a width of the upper recess is greater than that of the lower recess.

9. The recessed transistor of claim 1, wherein the gate electrode directly contacts the side surfaces of the isolation layer in the cross sectional direction along the width of the recessed transistor.

10. A recessed transistor, comprising:
   an isolation layer establishing an active region and a field region of a substrate;
   a recessed structure having an upper recess on a surface portion of the active region and a lower recess in communication with the upper recess;
   an active pin in the active region between side surfaces of the isolation layer and the lower recess and between interfaces of the active region and the field region, wherein the active pin encloses the lower recess of the recessed structure in a cross sectional direction along a width of the recessed transistor;
   a gate insulation layer on a side surface and a bottom surface of the recessed structure;
   a gate electrode on the gate insulation layer in the recessed structure and on the isolation layer, the gate electrode having a linear shape extending on the gate insulation layer and the isolation layer in the cross sectional direction along the width of the recessed transistor; and
   source and drain regions in the active region adjacent to the gate electrode,
   wherein the active pin includes a first active pin portion and a second active pin portion in the cross sectional direction, the first and second active pin portions having top surfaces lower than a top surface of the isolation layer, and
   the first active pin portion, the lower recess and the second active pin portion are between side surfaces of the isolation layer in the cross sectional direction along the width of the recessed transistor, the lower recess being between the first active pin portion and the second active pin portion in the cross sectional direction.

* * * * *